(12) United States Patent
Maeda

(10) Patent No.: US 7,971,973 B2
(45) Date of Patent: Jul. 5, 2011

(54) ELECTRICAL CONNECTION STRUCTURE, LIQUID EJECTION HEAD, METHOD OF MANUFACTURING SAME, AND IMAGE FORMING APPARATUS

(75) Inventor: Yasuhiko Maeda, Kanagawa (JP)

(73) Assignee: Fujifilm Corporation, Tokyo (JP)

( * ) Notice: Subject to any disclaimer, the term of this patent is extended or adjusted under 35 U.S.C. 154(b) by 1327 days.

(21) Appl. No.: 11/520,582

(22) Filed: Sep. 14, 2006

(65) Prior Publication Data

US 2007/0063206 A1    Mar. 22, 2007

(30) Foreign Application Priority Data

Sep. 16, 2005   (JP) ................... 2005-270727

(51) Int. Cl.
*B41J 2/05* (2006.01)
(52) U.S. Cl. ............... 347/58; 347/50; 347/59; 347/71
(58) Field of Classification Search .............. 347/50, 347/58, 59, 71, 72; 361/749, 748; 174/262, 174/264
See application file for complete search history.

(56) References Cited

U.S. PATENT DOCUMENTS

| 5,948,533 | A | * | 9/1999 | Gallagher et al. | ............ 428/418 |
| 6,534,723 | B1 | * | 3/2003 | Asai et al. | ............ 174/255 |
| 2002/0167567 | A1 | | 11/2002 | Saito et al. | |
| 2004/0113994 | A1 | | 6/2004 | Shinkai | |
| 2004/0246688 | A1 | * | 12/2004 | Pai et al. | ............ 361/760 |
| 2005/0062806 | A1 | * | 3/2005 | Terakura et al. | ............ 347/72 |

FOREIGN PATENT DOCUMENTS

| JP | 7-169873 A | 7/1995 |
| JP | 11-260860 A | 9/1999 |
| JP | 2000-343704 A | 12/2000 |
| JP | 2003-25587 A | 1/2003 |
| JP | 2004-136663 A | 5/2004 |
| JP | 2004-241719 A | 8/2004 |
| JP | 2004-262190 A | 9/2004 |

\* cited by examiner

*Primary Examiner* — Matthew Luu
*Assistant Examiner* — Henok Legesse
(74) *Attorney, Agent, or Firm* — Birch, Stewart, Kolasch & Birch, LLP

(57) ABSTRACT

The electrical connection structure includes: a first substrate which has a first electrode part; a second substrate which has a second electrode part opposing the first electrode part, and a wiring pattern connected to the second electrode part; an insulating cavity substrate which is disposed between the first substrate and the second substrate and has a through hole in a position corresponding to the first electrode part, the through hole being deeper that a sum of a height of the first electrode part and a height of the second electrode part and having an opening surface area not smaller that an area of the first electrode part; and conductive material which is filled in the through hole.

10 Claims, 17 Drawing Sheets

COMPARATIVE EXAMPLE

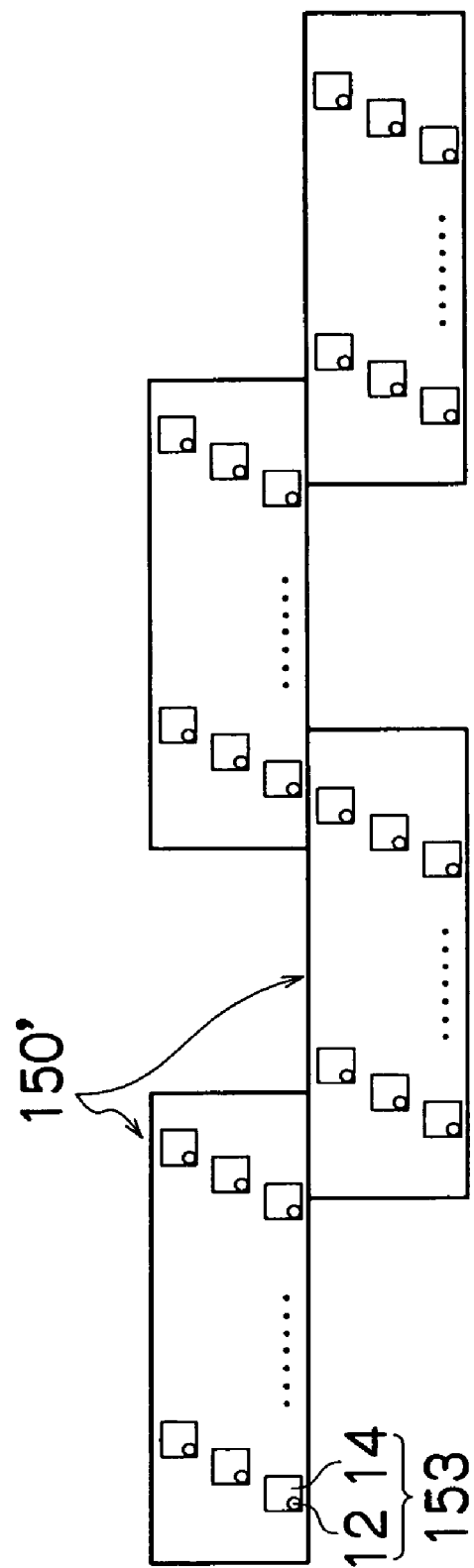

ELECTRICAL CONNECTION STRUCTURE, LIQUID EJECTION HEAD, METHOD OF MANUFACTURING SAME, AND IMAGE FORMING APPARATUS

BACKGROUND OF THE INVENTION

1. Field of the Invention

The present invention relates to electrical connection technology for connecting electrodes between substrates, and more particularly, to an electrical connection structure such as power supply wires to piezoelectric elements for driving ejection in an inkjet head, for instance, which are suitable for creating electrical connections between the terminals of wiring substrate and a plurality of electrode elements arranged two-dimensionally at high density, a liquid ejection head using this electrical connection structure, a method of manufacturing same, and an image forming apparatus.

2. Description of the Related Art

Japanese Patent Application Publication No. 2004-262190 discloses technology for connecting a flexible printed circuit (FPC) with piezoelectric elements by means of solder balls. In Japanese Patent Application Publication No. 2004-262190, solder balls with a core are used partially, thereby preventing the phenomenon of bursting of the solder and suppressing undulation (waving) of the FPC board.

Japanese Patent Application Publication No. 2004-136663 discloses technology for connecting a flexible printed circuit with the electrodes of piezoelectric elements, by using an anisotropic conductive paste (ACP) or a non-conductive paste (NCP), or the like.

Japanese Patent Application Publication No. 2003-25587 discloses technology for preventing disconnections between bumps and connection terminals, and shorting between adjacent electrodes, by forming insulating films of prescribed amount of projection between the bumps on a substrate, and electrically connecting bumps and connection terminals together inside the cavity (groove) between adjacent insulating films.

Japanese Patent Application Publication No. 2004-262190 relates to a method for creating direct electrical connections between the electrodes of piezoelectric elements and a flexible printed circuit, and it partially uses-solder balls with a core in order to ensure a space between the flexible printed circuit and the piezoelectric elements. However, in the case of this method, since the FPC board is soft, it is difficult to position the substrate during the assembly, and it is extremely difficult to ensure connection reliability with respect to a large number of electrodes in a two-dimensional matrix arrangement.

In Japanese Patent Application Publication No. 2004-136663, various electrical connection materials are used, but similarly to Japanese Patent Application Publication No. 2004-262190, substances which can act as bumps exist all over the place between the piezoelectric substrate and a flexible printed circuit, and since the FPC board is soft, then it is extremely difficult to position the substrate over a large surface area. Consequently, it is limited to use in cases where connections are formed over a relatively small surface area.

In order to resolve the problems associated with Japanese Patent Application Publication Nos. 2004-262190 and 2004-136663, Japanese Patent Application Publication No. 2003-25587 prevents shorting between mutually adjacent electrodes by positioning both of the pair of a connection terminal and a bump located between the two substrates, inside a groove (cavity) between the adjacent insulating films which are lower than the combined heights of the connection terminal and the bump, and it connects the electrodes reliably by filling an anisotropic conductive adhesive into the cavity.

However, the method described in Japanese Patent Application Publication No. 2003-25587 is only applicable to electrodes which are arranged one-dimensionally, and it is difficult to ensure good connection reliability for all of the electrodes in the case of electrodes arranged in a high-density two-dimensional matrix structure over a long and large surface area.

SUMMARY OF THE INVENTION

The present invention has been contrived in view of the foregoing circumstances, an object thereof being to provide an electrical connection structure which can ensure high connection reliability between electrodes and can also be applied to the connection of a plurality of electrodes arranged in a two-dimensional matrix structure, as well as providing a liquid ejection head using this electrical connection structure, a method of manufacturing same, and an image forming apparatus.

In order to attain the aforementioned object, the present invention is directed to an electrical connection structure, comprising: a first substrate which has a first electrode part; a second substrate which has a second electrode part opposing the first electrode part, and a wiring pattern connected to the second electrode part; an insulating cavity substrate which is disposed between the first substrate and the second substrate and has a through hole in a position corresponding to the first electrode part, the through hole being deeper than a sum of a height of the first electrode part and a height of the second electrode part and having an opening surface area not smaller than an area of the first electrode part; and conductive material which is filled in the through hole.

According to this aspect of the present invention, when electrically connecting the first electrode part formed on the first substrate and the second electrode part formed on the second substrate, the insulating cavity substrate is interposed between the two substrates, the pair of the first electrode part and the second electrode part that are to be connected are disposed in mutually opposing positions via the through hole in the cavity substrate, and the electrical connection is made between the first electrode part and the second electrode part by means of the conductive material filled in the through hole. Accordingly, it is possible to achieve reliable connections between the first electrode part and the second electrode part. Furthermore, since the through hole is deeper than the sum of the height of the first electrode part and the height of the second electrode part and has the opening surface area that is equal to or larger than the region of the first electrode part, then height variations in the first electrode part and the second electrode part, and positional variations between the two electrode parts, or the like, are absorbed by the size of the through hole, and hence positioning during the assembly process is relatively simple, and the second substrate can be bonded while ensuring the flatness of the second substrate by following the flatness of the cavity substrate.

For example, for the "conductive material", it is suitable to use an isotropic conductive material, such as a conductive adhesive, solder, metallic paste, or the like.

Preferably, the first substrate has a plurality of the first electrode parts arranged in a two-dimensional matrix configuration; and the second substrate is formed of a flexible printed circuit board.

According to this aspect of the present invention, the cavity substrate makes it possible to achieve reliable insulation between mutually adjacent electrodes, in respect of the first electrode parts arranged in the two-dimensional matrix shape. Furthermore, the pair of the first electrode part and the second electrode part that are to be connected are disposed in mutually opposing positions via a common (the same) through hole, and are connected electrically via the conductive material filled in the through hole. Consequently, it is possible to ensure high connection reliability. Furthermore, since positional variations and height variations in the first electrode part and the second electrode part are absorbed by the through hole in the cavity substrate, then it is possible to ensure the flatness of the second substrate (flexible printed circuit board).

Preferably, there are a plurality of the second substrates mutually superimposed and bonded; each of the second substrates has a plurality of the second electrode parts respectively opposing a portion of the first electrode parts; the second electrode parts are arranged in the second substrates with no overlaps to each other between the second substrates; through holes of the second substrates are formed in at least one of the second substrates to which a further one of the second substrates is bonded on a far side from the insulating cavity substrate in a state of being mutually superimposed and bonded, in positions corresponding to the second electrode parts in the further one of the second substrates; and the conductive material is filled in the through holes of the at least one of the second substrates.

According to this aspect of the present invention, since a structure is adopted in which the plurality of second substrates (here, the flexible printed circuit boards) are mutually superimposed, and electrical connections are made between the substrates by means of vias formed of the conductive material filled in the through holes passing through the substrates, then it is possible to supply power to the electrodes arranged in a high-density, by using flexible printed circuit boards having wiring patterns of relatively low density. Furthermore, similarly to the through holes in the cavity substrate, by making the opening surface area of the through holes formed in the second substrate equal to or larger than the region of the first electrode parts (namely, increasing the opening surface area within a tolerable range which enables insulation from the adjacent electrodes to be ensured), it is possible to position reliably during the assembly.

Preferably, each of the second substrates is formed of the flexible printed circuit board which is single-sided and has the wiring pattern and the second electrode parts on a surface on a near side to the insulating cavity substrate in the state of being mutually superimposed and bonded.

According to this aspect of the present invention, it is possible to make wiring connections for the electrode group (first electrodes), which is arranged in a high-density two-dimensional matrix shape, by using relatively inexpensive single-sided flexible printed circuit boards (not having very fine-patterned wiring) manufactured by subtractive method, or the like.

In order to attain the aforementioned object, the present invention is also directed to a liquid ejection head, comprising: a plurality of ejection ports which eject liquid; a plurality of pressure chambers which are connected respectively to the ejection ports; a plurality of pressure generating elements which are provided correspondingly to the pressure chambers and create a pressure change in the liquid in the pressure chambers; a first substrate which has a plurality of first electrode parts electrically connected respectively to the pressure generating elements, the first electrode parts arranged in a two-dimensional matrix configuration; a second substrate which has a plurality of second electrode parts opposing the first electrode parts, and wiring patterns connecting to the second electrode parts; an insulating cavity substrate which is disposed between the first substrate and the second substrate and has through holes in positions corresponding to the first electrode parts, the through holes being deeper than a sum of a height of the first electrode part and a height of the second electrode part and having an opening surface area not smaller than an area of the first electrode part; and conductive material which is filled in the through holes.

According to this aspect of the present invention, it is possible to provide a liquid ejection head having high reliability, at relatively low cost. The "pressure generating element" in the present invention may be a mode which uses a piezoelectric element or other actuator that changes the volume of the pressure chamber, or a mode which uses a heater (heating element) which heats and to make a bubble in the liquid in the pressure chamber.

Preferably, the liquid ejection head further comprises: a diaphragm which forms a portion of walls of the pressure chambers; piezoelectric elements which function as the pressure generating elements and are arranged on a surface of the diaphragm reverse to a surface adjacent to the pressure chambers; a common liquid chamber which is arranged in a space on a side of the diaphragm reverse to the surface adjacent to the pressure chambers, is connected to the pressure chambers, and supplies the liquid to the pressure chambers; and drive wiring members which are electrically connected to the piezoelectric elements, each of the drive wiring members being formed in such a manner that at least a portion thereof rises upward through the common liquid chamber in a substantially perpendicular direction with respect to the surface on which the piezoelectric elements are arranged, wherein land parts corresponding to the first electrode parts relating respectively to the drive wiring members are arranged in a two-dimensional matrix configuration on the first substrate.

According to this aspect of the present invention, the common liquid chamber is formed on the side of the diaphragm opposite from the pressure chambers, and the drive wiring members are erected so as to pass through this common liquid chamber. The drive wiring members function as a column structure which preserves the space for the common liquid chamber, and by means of this structure, it is possible to arrange the piezoelectric elements at high density (and hence, to arrange the nozzles at high density), at the same time as being able to ensure the rigidity of the common liquid chamber. Furthermore, it is possible to reduce the flow channel resistance of the liquid supply channels from the common liquid chamber to the pressure chambers, and a sufficient liquid supply volume can be ensured, even in the case of a high-viscosity liquid.

In respect of the electrical connection structure in the liquid ejection head of the present invention, a mode where a flexible printed circuit is used as the second substrate is possible, and furthermore, a mode where a plurality of second substrates are mutually superimposed is possible, and a mode where single-sided flexible printed circuits are used is possible, as described above.

In order to attain the aforementioned object, the present invention is also directed to an image forming apparatus, comprising the above-described liquid ejection head, and forming an image on a recording medium by means of liquid droplets ejected from the ejection ports.

According to this aspect of the present invention, color conversion or halftoning is carried out on the basis of image data (print data) inputted via an image input device, thereby generating ink ejection data corresponding to the ink colors. The pressure generating elements corresponding to the nozzles of the liquid ejection head are driven and controlled on the basis of the ink ejection data, in such a manner that ink droplets are ejected from the nozzles. In order to achieve a high-resolution image output, a desirable mode is one using the liquid ejection head (print head) in which the liquid droplet ejection elements (ink chamber units) are arranged at high density, each liquid droplet ejection element comprising the nozzle (ejection port) which ejects ink liquid, and the pressure chamber and the pressure generating element corresponding to the nozzle.

A compositional example of a liquid ejection head for printing of this kind is a full line type head having a nozzle row in which a plurality of ejection ports (nozzles) are arranged through a length corresponding to the full width of the recording medium. In this case, a mode may be adopted in which a plurality of relatively short ejection head modules having nozzles rows which do not reach a length corresponding to the full width of the recording medium are combined and joined together, thereby forming nozzle rows of a length that correspond to the full width of the recording medium.

A full line type head is usually disposed in a direction that is perpendicular to the relative feed direction (relative conveyance direction) of the recording medium, but a mode may also be adopted in which the head is disposed following an oblique direction that forms a prescribed angle with respect to the direction perpendicular to the conveyance direction.

"Recording medium" indicates a medium which receives the deposition of ink ejected from the ejection ports of a liquid ejection head (this medium may also be called a print medium, image forming medium, image receiving medium, ejection receiving medium, or the like). This term includes various types of media, irrespective of material and size, such as continuous paper, cut paper, sealed paper, resin sheets, such as OHP sheets, film, cloth, a printed circuit board on which wiring patterns, or the like, are formed, and an intermediate transfer medium, and the like.

The movement device for causing the recording medium and the liquid ejection head to move relatively to each other may include a mode where the recording medium is conveyed with respect to a stationary (fixed) head, or a mode where a head is moved with respect to a stationary recording medium, or a mode where both the head and the recording medium are moved. When forming color images by means of an inkjet print head, it is possible to provide type print heads for each color of a plurality of colored inks (recording liquids), or it is possible to eject inks of a plurality of colors, from one print head.

In order to attain the aforementioned object, the present invention is also directed to a method of manufacturing a liquid ejection head, comprising: a first substrate forming step of forming a first substrate on which a plurality of first electrode parts to be electrically connected respectively to a plurality of pressure generating elements arranged correspondingly to a plurality of pressure chambers are formed in a two-dimensional matrix arrangement configuration; a second substrate forming step of forming a second substrate on which a plurality of second electrode parts opposing the first electrode parts, and wiring patterns connected to the second electrode parts are arranged; a cavity substrate bonding step of arranging and bonding an insulating cavity substrate onto the first substrate, the insulating cavity substrate having through holes in positions corresponding to the first electrode parts, the through holes being deeper than a sum of a height of the first electrode part and a height of the second electrode part and having an opening surface area not smaller than an area of the first electrode part; a conductive material filling step of filling conductive material into the through holes in the cavity substrate; and an electrical connection step of electrically connecting the first substrate and the second substrate by arranging and bonding the second substrate onto an opposite side of the first substrate with the cavity substrate therebetween, in such a manner that the first electrodes and the second electrodes are mutually opposing via the through holes.

According to this aspect of the present invention, it is possible to manufacture the liquid ejection head having high reliability, at relatively low cost. The method for filling conductive material into the through holes may use a mode based on screen printing, or a mode using a dispenser, for example.

According to the electrical connection structure of the present invention, it is possible to connect the first electrodes and the second electrodes reliably, by means of the conductive material filled in the through holes in the cavity substrate. Furthermore, since variations in the positions of the first electrode parts and the second electrode parts, and variations in the height of both electrode parts, and the like, can be absorbed by the size of the through holes, then positioning during lamination is relatively simple, and the second substrate can be arranged bonded while ensuring the flatness of the second substrate.

Moreover, according to the present invention, it is possible to provide the liquid ejection head having high reliability, at relatively low cost, and to provide the image forming apparatus using this liquid ejection head.

BRIEF DESCRIPTION OF THE DRAWINGS

The nature of this invention, as well as other objects and advantages thereof, will be explained in the following with reference to the accompanying drawings, in which like reference characters designate the same or similar parts throughout the figures and wherein:

FIG. 19 is a plan diagram showing a further embodiment of the composition of a full line head.

DETAILED DESCRIPTION OF THE PREFERRED EMBODIMENTS

Below, a preferred embodiment of the present invention is described with reference to the accompanying drawings. Here, an electrical connection structure is described which supplies power by means of a flexible printed circuit (FPC) to a plurality of electrodes arranged at high density and narrow pitch in a two-dimensional matrix configuration which is characteristic of a long, line type of inkjet head.

Figure 1:
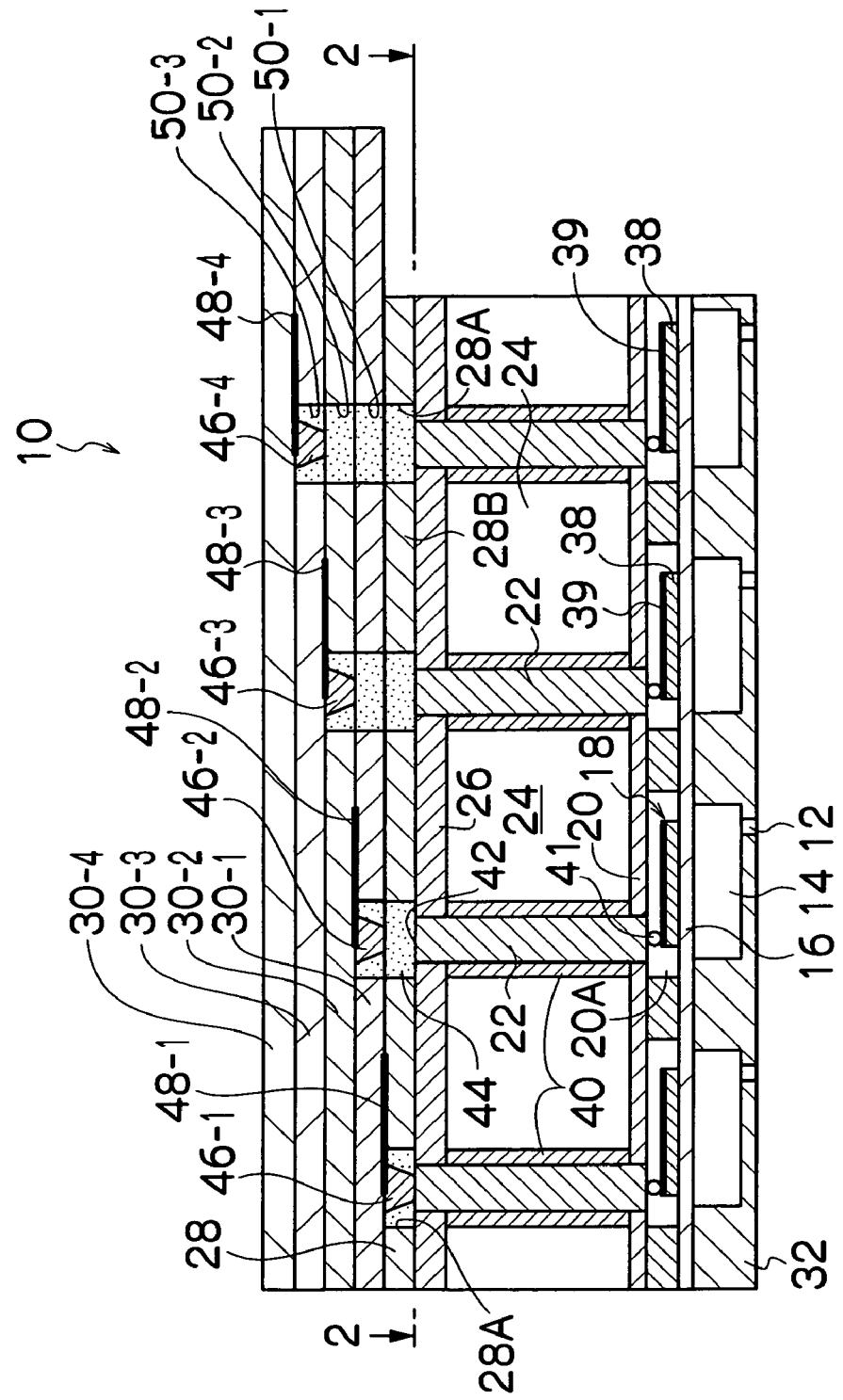
FIG. 1 is a cross-sectional diagram showing the composition of a liquid ejection head including an electrical connection structure according to an embodiment of the present invention.

FIG. 1 is a cross-sectional diagram showing the composition of a liquid ejection head using an electrical connection structure relating to the present embodiment. The liquid ejection head 10 comprises: a nozzle 12 forming an ink ejection port; a pressure chamber 14; a diaphragm 16; a piezoelectric element 18 (corresponding to a "pressure generating element"); an intermediate plate 20; a column-shaped wiring member 22; a common liquid chamber 24; a common liquid chamber forming substrate 26 (corresponding to a "first substrate") which is a plate-shaped member that seals the ceiling of the common liquid chamber 24; a cavity substrate 28 for wiring connections; and FPC boards 30-1 to 30-4 (each corresponding to a "second substrate").

The nozzles 12 and the spaces for the pressure chambers 14 connected to the nozzles 12 are formed in the flow channel forming member 32, which may be formed as a single plate member in which prescribed flow channel-shaped sections (openings, grooves, and the like) are formed, or as a body laminated from a plurality of plate members, formed with openings and grooves (recesses) for creating prescribed flow channel-shaped sections.

The diaphragm 16 is a member which forms a portion of the walls of the pressure chambers 14 (in FIG. 1, the ceiling), and it is made of a metallic material, such as stainless steel, whereby it also serves as a common electrode for the plurality of piezoelectric elements 18. A mode is also possible in which a diaphragm is formed by a non-conductive material made of resin, or the like, in which case a common electrode layer made of a conductive material of metal, or the like, is formed on the surface of the diaphragm member.

Piezoelectric bodies 38 are arranged on the surface of the diaphragm 16 on the opposite side (in FIG. 1, the upper side) to that of the pressure chambers 14, at positions corresponding to the respective pressure chambers 14. Individual electrodes 39 are formed on the upper surface of the piezoelectric bodies 38 (the surface on the opposite side to the surface contacting the diaphragm 16, which also serves as the common electrode). Each piezoelectric element 18 comprises the individual electrode 39, the common electrode opposing same (which in this case the diaphragm 16 also serves as), and a piezoelectric body 38 arranged between the electrodes. A piezoelectric material, such as lead titanate zirconate or barium titanate is suitable for use as the piezoelectric body 38.

The intermediate plate 20 functions as a cover plate and a spacer member, which ensures displacement spaces for the respective piezoelectric elements 18, as well as covering the upper portion of the piezoelectric elements 18, and serves to protect the piezoelectric elements 18 from the common liquid chamber 24 (thereby preventing contact with the ink). More specifically, recesses 20A corresponding to the piezoelectric elements 18 are formed in the intermediate plate 20, the piezoelectric elements 18 are accommodated between the recesses 20A and the diaphragm 16, and a prescribed space is ensured about the periphery of each piezoelectric element 18.

Furthermore, although not shown in FIG. 1, ink supply channels connecting the intermediate plate 20 and the diaphragm 16 are formed in the intermediate plate 20 and the diaphragm 16 at positions which avoid the recesses 20A in which the piezoelectric elements 18 are accommodated. The common liquid chamber 24 and the pressure chambers 14 are connected by means of these ink flow channels, and ink is supplied to the pressure chambers 14 from the common liquid chamber 24 through the ink flow channels. A supply system connection port (not shown) for guiding ink into the common liquid chamber 24 is formed in the common liquid chamber forming substrate 26 or in a member (not shown) which constitutes the side wall parts of the common liquid chamber 24, and an ink tank is connected through a prescribed channel to the supply system connection port.

The column-shaped wiring members 22 are erected between the intermediate plate 20 and the common liquid chamber forming substrate 26 so as to rise up inside the common liquid chambers 24, in a substantially perpendicular direction with respect to the surface of the diaphragm 16, on which the piezoelectric elements 18 are arranged. The circumferential surface of each column-shaped wiring member 22 is covered with an insulating member 40.

The end part of each column-shaped wiring member 22 on the side by the intermediate plate 20 is connected electrically to the individual electrode 39 of each piezoelectric element 18 through a conductive connection member 41. It is possible to use a suitable member, such as a solder ball, conductive adhesive, or the like, for the conductive connection member 41.

The other end part of each column-shaped wiring member 22 (the end part on the side by the common liquid chamber forming substrate 26) is exposed to form a land 42 (corresponding to the "first electrode part") on the upper surface of the common liquid chamber forming substrate 26. These lands 42 are electrically connected to bumps 46-1 to 46-4 (each corresponding to the "second electrode part") on the FPC boards 30-1 to 30-4, through conductive material 44 filled in through holes 28A in the cavity substrate 28.

More specifically, the cavity substrate 28 is an insulating substrate having the plurality of through holes 28A corresponding to the lands 42, and is disposed on top of the common liquid chamber forming substrate 26. The conductive material 44 is filled in the through holes 28A. Each through hole 28A has an opening surface area that is larger than the region of the land 42. The land 42 and one of bumps 46-1 to 46-4 composing a pair are disposed in positions mutually opposing through the through hole 28A, and they are electrically connected through the conductive material 44. Furthermore, mutually adjacent lands 42 are reliably insulated by means of partition parts 28B of the through holes 28A (the portions of the cavity substrate 28 apart from the through holes 28A).

From the viewpoint of thermal stress, desirably, the cavity substrate 28 has a coefficient of linear thermal expansion which is an intermediate value between that of the underlying substrate (in the present embodiment, the common liquid chamber forming substrate 26), and that of the FPC boards 30-1 to 30-4.

The FPC boards 30-1 to 30-4 have wiring patterns 48-1 to 48-4, respectively. As shown in FIG. 1, each of the FPC boards 30-1 to 30-4 in the present embodiment employs a single-sided FPC having corresponding one of the wiring patterns (wiring electrode patterns) 48-1 to 48-4 and corresponding one of bumps 46-1 to 46-4 (which are formed of gold, for example) only on one side (the lower surface in FIG. 1).

As devices for creating electrical connections with the FPC boards 30-2 to 30-4 disposed in upper layers, through holes 50-1 to 50-3 are formed in the FPC boards 30-1 to 30-3 of the plurality of (here, four in FIG. 1) FPC boards 30-1 to 30-4, with the exception of the FPC board in the uppermost layer (i.e., the FPC board 30-4, the fourth from the bottom), and the conductive material 44 is filled in these through holes 50-1 to 50-3.

In this way, all of the lands 42 are respectively connected electrically to the bumps 46-1 to 46-4 of the corresponding FPC boards 30-1 to 30-4. A drive circuit (not shown) is connected to the ends of the wires of the FPC boards 30-1 to 30-4.

In the composition described above, power is supplied through the FPC boards 30-1 to 30-4, and the piezoelectric elements 18 are deformed by applying drive voltages between the individual electrodes 39 and the common electrode (which the diaphragm 16 also serves as), thereby changing the volume of the pressure chambers 14 and causing ink to be ejected from the nozzles 12 due to the consequent pressure changes. When the displacement of the piezoelectric element 18 returns to its original position after ejecting ink, the pressure chamber 14 is replenished with new ink from the common liquid chamber 24, through an ink supply port (not shown).

By adopting the structure in which the common liquid chamber 24 is disposed on the upper side of the diaphragm 16 (the opposite side to the pressure chambers 14), and the ink is supplied to the pressure chambers 14 in lower positions through the ink supply channels passing in a substantially perpendicular direction through the diaphragm surface, then it is possible to reduce the flow channel resistance on the supply side, and hence ink refill characteristics can also be improved.

Figure 2:
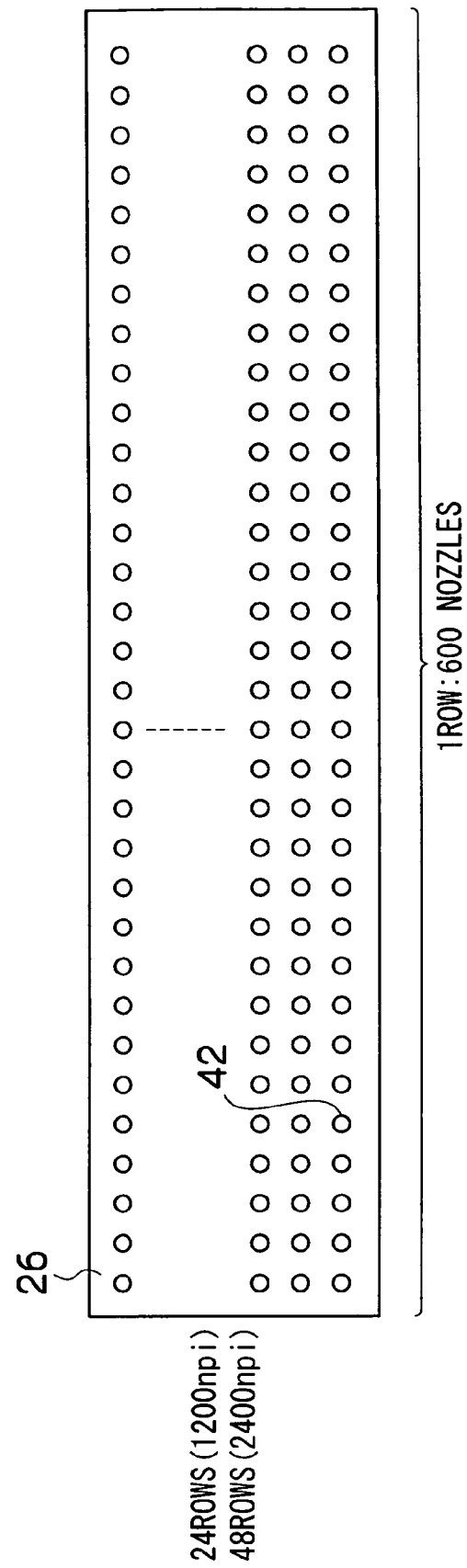
FIG. 2 is a planar schematic drawing showing an embodiment of an arrangement of lands exposed on the upper surface of a common liquid chamber forming substrate in FIG. 1.

FIG. 2 is a plan diagram of the lands 42 exposed on the upper surface of the common liquid chamber forming substrate 26 as viewed from above (an upper view of the plane along line 2-2 in FIG. 1). For the common liquid chamber forming substrate 26, the plurality of lands 42 corresponding to the arrangement mode of the pressure chambers 14 shown in FIG. 1 (in other words, the arrangement mode of the piezoelectric elements 18) are formed in a two-dimensional matrix configuration. In other words, the arrangement mode of the lands 42 reflects the arrangement mode of the nozzles 12.

For the purpose of the description, in the matrix arrangement shown in FIG. 2, the horizontal direction in FIG. 2 is referred to as the row direction (the main scanning direction of a full line type inkjet recording apparatus described hereinafter), and the vertical direction in FIG. 2 (the sub-scanning direction) is referred to as the column direction.

In order to simplify the illustration, FIG. 2 shows a model view of the electrodes arranged in a square matrix configuration, but in an actual head, the nozzles of the respective rows are arranged in a staggered matrix fashion by altering the nozzle positions in the main scanning direction between each row, and hence an oblique matrix-shaped arrangement is obtained.

For example, 24 rows of nozzles are arranged in the sub-scanning direction, each nozzle row including 600 nozzles arranged linearly at a constant interval in the row direction, thereby arranging a total of 600×24=14400 nozzles, and an effective nozzle density of 1200 npi (nozzles per inch) is achieved in the main scanning direction. Alternatively, 48 rows of nozzles are arranged in the sub-scanning direction, each nozzle row including 600 nozzles arranged linearly at a constant interval in the row direction, thereby arranging a total of 600×48=28800 nozzles, and an effective nozzle density of 2400 npi is achieved in the main scanning direction.

The lands 42 arranged in the two-dimensional matrix structure are formed on the upper surface of the common liquid chamber forming substrate 26 situated on the uppermost part of the flow channel structure, so as to reflect the matrix nozzle arrangement.

Figure 3:
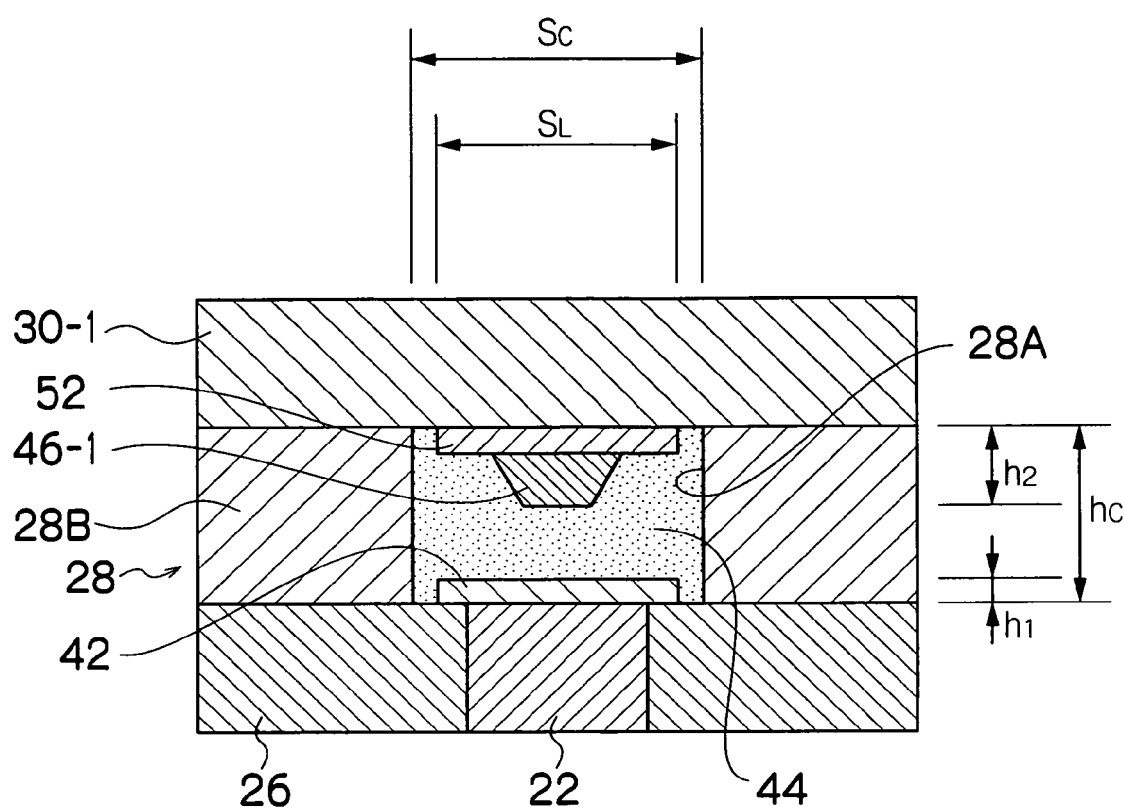
FIG. 3 is an enlarged view of an electrical connection part.

FIG. 3 is an enlarged diagram of an electrical connection part which connects the wiring pattern on the FPC board to the electrodes having the two-dimensional matrix structure shown in FIG. 2. As shown in FIG. 3, the connection land 42 which is in connection with the column-shaped wiring member 22 is formed on the upper surface of the common liquid chamber forming substrate 26. Furthermore, the bump 46-1 is formed in a downward-projecting shape on the land 52 of the FPC board 30-1.

The land 52 on the FPC board 30-1 is connected to the wiring pattern 48-1 (shown in FIG. 1, and not shown in FIG. 3). In the present embodiment, the terminal part including the land 52 and the bump 46-1 corresponds to the "second electrode part". The bump 46-1 having a circular conical shape with the pointed end facing downward is shown in FIG. 3, but there are no particular restrictions on the shape of the bump and various different modes are possible, such as a substantially hemispherical shape.

The thickness of the cavity substrate 28 disposed between the common liquid chamber forming substrate 26 and the FPC board 30-1 (in other words, the depth of the through hole 28A) $h_C$ is formed to be greater than the sum of the height $h_1$ of the land 42 of the common liquid chamber forming substrate 26 and the height $h_2$ of the bump 46-1 of the FPC board 30-1 (the combined thickness of the land 52 plus the bump 46-1)(i.e., $h_C > h_1 + h_2$). Consequently, height variations in the land 42 and the bump 46-1 disposed in the positions opposing through the through hole 28A are absorbed by the depth of the through hole 28A. In other words, the thickness dimension of the cavity substrate 28 (the depth dimension of the through hole 28A) is designed to a level that allows absorption of expected height variations in the lands 42 and 52 and the bump 46-1.

The cross-sectional width dimension $S_C$ of the opening of the through hole 28A is formed to be larger than the cross-sectional dimension $S_L$ of the region of the lands 42 and 52 (i.e., $S_C > S_L$). In other words, the opening surface area (cross-sectional area) $A_C$ of the through hole 28A corresponding to the cross-sectional width dimension $S_C$ is greater than the region (surface area) $A_L$ of the lands 42 and 52 corresponding to the cross-sectional width dimension $S_C$, in such a manner that positional variations between opposing lands 42 and 52 can be absorbed by the size of the through hole 28A.

If the opening surface area of the through hole 28A is made too large, then incorrect connections may occur due to interference with adjacent lands. Hence, the through holes 28A are formed with a suitable size larger than the region of the lands 42 and prevented from contact with adjacent electrodes.

In order to ensure reliable connection between the land 42 and the bump 46-1 that are in positions mutually opposing via the through holes 28A, the conductive material 44, which is isotropic, is filled into the through holes 28A.

The present embodiment relates to a case where the surface area of the lands 42 on the common liquid chamber forming substrate 26 and the surface area of the lands 52 on the FPC board 30-1 are equal, but if these respective surface areas are different, then desirably, the opening surface area $S_C$ of the cavity substrate 28 is designed to be greater than the surface area of the larger lands.

Shorting (incorrect connections) with adjacent electrodes is avoided by adopting a structure in which the perimeter of each land 42 is enclosed by the partition part 28B of the through hole 28A, and only the pair of electrodes (here, 42 and 46-1) to be connected are accommodated in the region of the through hole 28A, which is filled with the conductive material 44. In other words, the partition part 28B at the perimeter of the through hole 28A in the cavity substrate 28 functions as an insulating member which provides electrical separation from adjacent lands.

Furthermore, the flatness of the FPC board 30-1 can be ensured by following the flat surface of the cavity substrate 28.

In FIG. 3, only one FPC board 30-1 is depicted, but as shown in FIG. 1, when the plurality of FPC boards 30-1 to 30-4 are mutually superimposed, then the through holes 50-1 to 50-3 for filling the conductive material 44 are formed in the lower FPC boards 30-1 to 30-3 themselves and by filling the isotropic conductive material 44 into the through holes 50-1 to 50-3, electrical connections are formed with the FPC boards 30-2 to 30-4 in the upper layers.

Manufacturing Embodiment 1

The procedure of the wiring connection is described by means of specific embodiments with reference to FIGS. 4 to 10.

Here, an embodiment is described in which wires extend from one end surface of the head in the sub-scanning direction, with respect to the electrodes (lands 42) of the two-dimensional matrix structure shown in FIG. 2.

(Step 1) Firstly, the cavity substrate 28 is arranged onto the surface of the common liquid chamber forming substrate 26 on which the lands 42 are formed, and the conductive material 44 is filled into the through holes 28A. As a method of filling the conductive material 44, it is possible to use a commonly known technique such as screen printing, a dispenser, or the like.

(Step 2) Next, the first FPC board 30-1 is arranged onto the cavity substrate 28, and the cavity substrate 28 and the first FPC board 30-1 are bonded together with an adhesive (for example, a polyimide adhesive).

Figure 4:
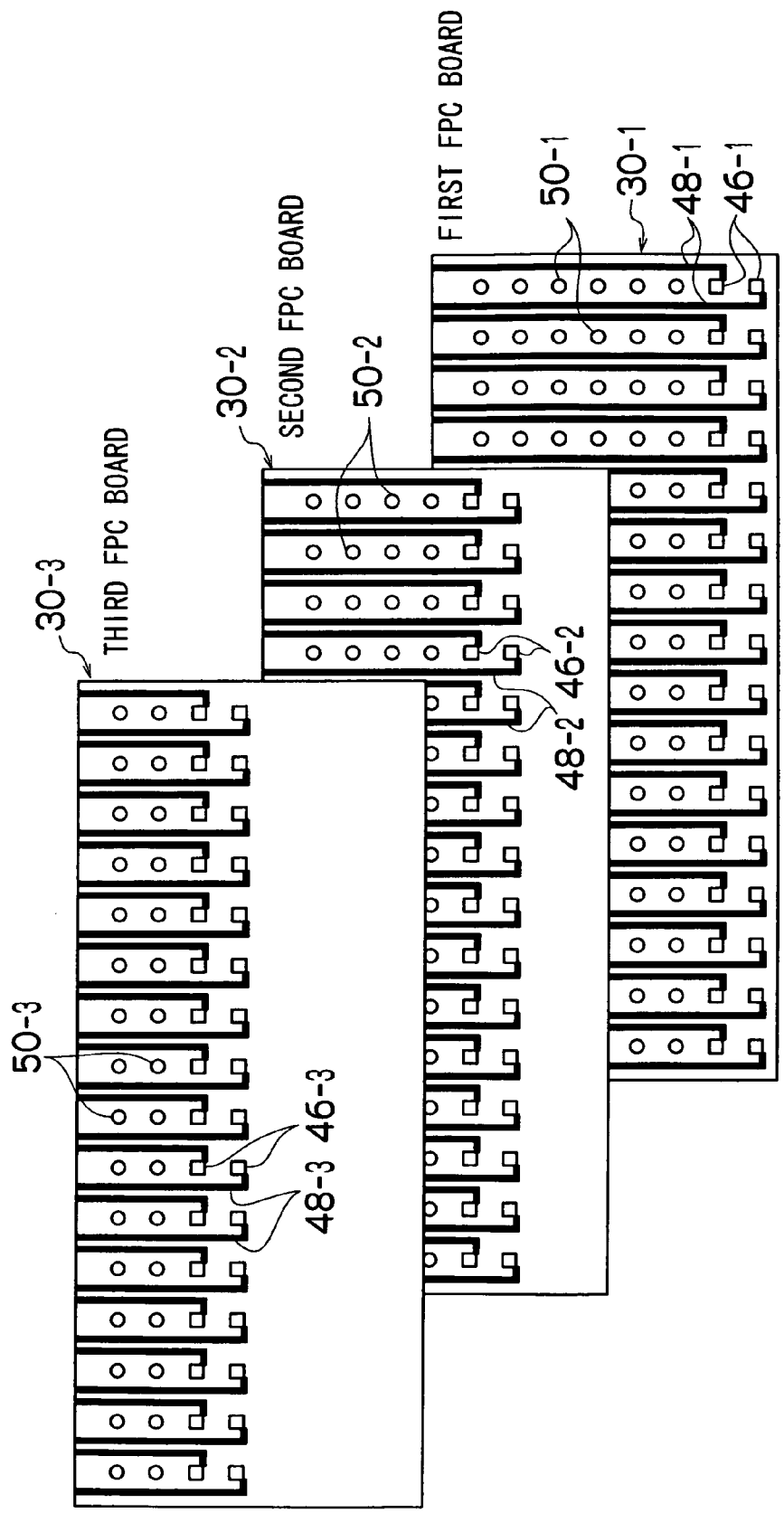
FIG. 4 is a plan diagram showing an embodiment of the composition of three FPC boards which are to be mutually superimposed.

As shown in FIG. 4, the first FPC board 30-1 has the wiring patterns 48-1 and the bumps 46-1 to be connected to the lands 42 in the two bottom rows, of the electrodes (lands 42) in the two-dimensional matrix structure shown in FIG. 2. In the present embodiment, the line width of the wiring patterns 48-1 is formed to approximately 50 μm, for example.

As shown in FIG. 1, the wiring patterns 48-1 and the bumps 46-1 are formed on the lower surface of the first FPC board 30-1 (the surface on the near side to the cavity substrate 28 shown in FIG. 1). Similarly, the wiring patterns 48-2 to 48-4 and the bumps 46-2 to 46-4 are formed respectively on the lower surfaces of the second and subsequent FPC boards 30-2 to 30-4 that are to be mutually superimposed.

The first FPC board 30-1 has the through holes 50-1 for creating the electrical connections with the second and subsequent FPC boards 30-2 to 30-4.

(Step 3) Thereupon, similarly to the cavity substrate 28, the conductive material 44 is filled into the through holes 50-1 of the first FPC board 30-1, and the second FPC board 30-2 is then arranged thereon and bonded with adhesive.

As shown in FIG. 4, the second FPC board 30-2 has the wiring patterns 48-2 and the bumps 46-2 to be connected to further lands 42 (in two rows) other than the two rows of lands 42 connected to the first FPC board 30-1. The second FPC board 30-2 also has the through holes 50-2 for creating the electrical connections with the third and subsequent FPC boards 30-3 and 30-4.

(Step 4) Thereupon, similarly to the first FPC board 30-1, the conductive material 44 is filled into the through holes 50-2 of the second FPC board 30-2, and the third FPC board 30-3 is then arranged thereon and bonded with adhesive.

As shown in FIG. 4, the third FPC board 30-3 has the wiring patterns 48-3 and the bumps 46-3 to be connected to further lands 42 (in two rows) other than the four rows of lands 42 connected to the first and second FPC boards 30-1 and 30-2. The third FPC board 30-3 also has the through holes 50-3 for creating the electrical connections with the fourth FPC board 30-4.

Figure 5:
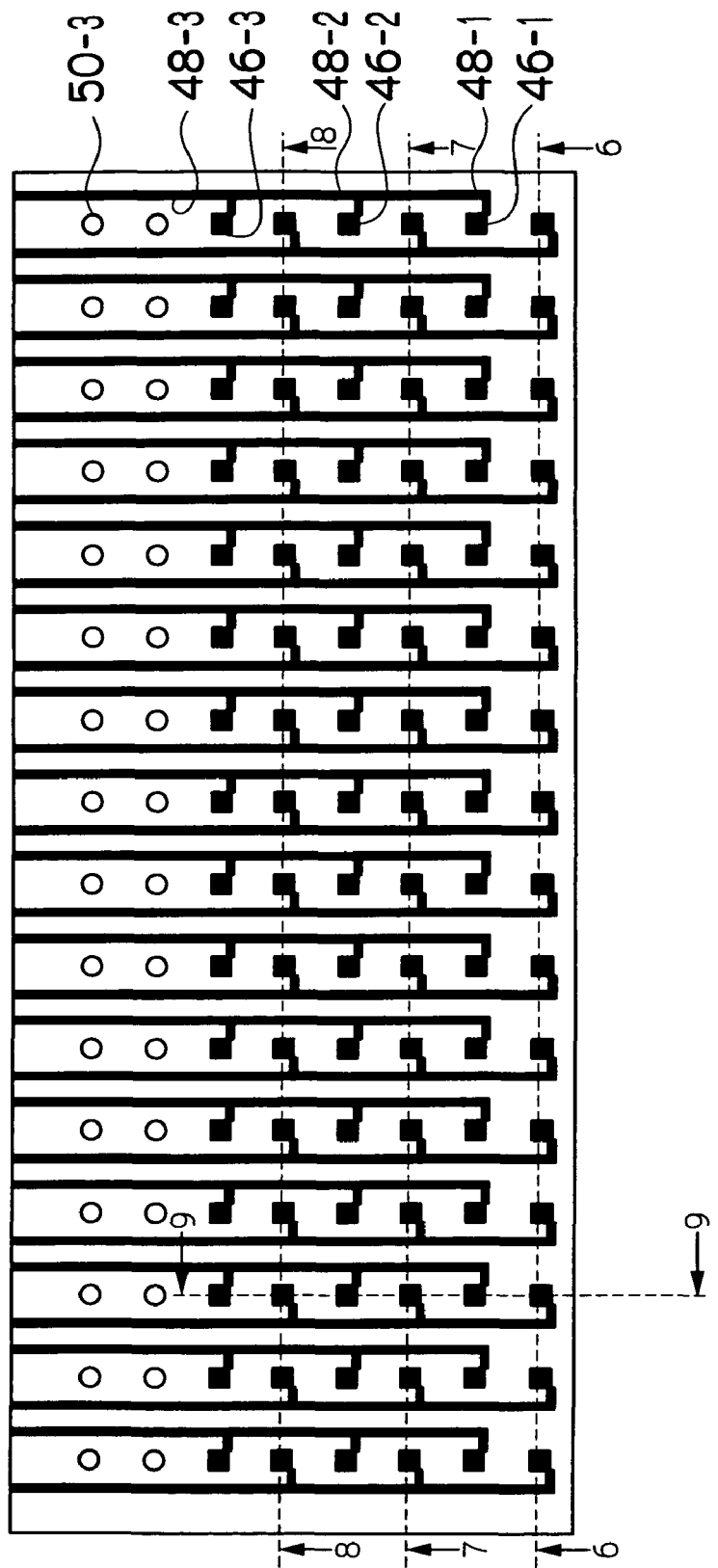
FIG. 5 is a plan diagram showing a state where the three FPC boards in FIG. 4 have been superimposed.
Figure 6:
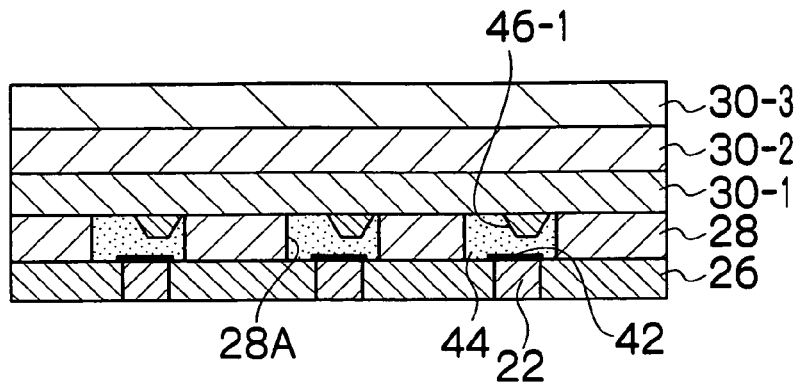
FIG. 6 is a cross-sectional diagram along line 6-6 in FIG. 5.
Figure 7:
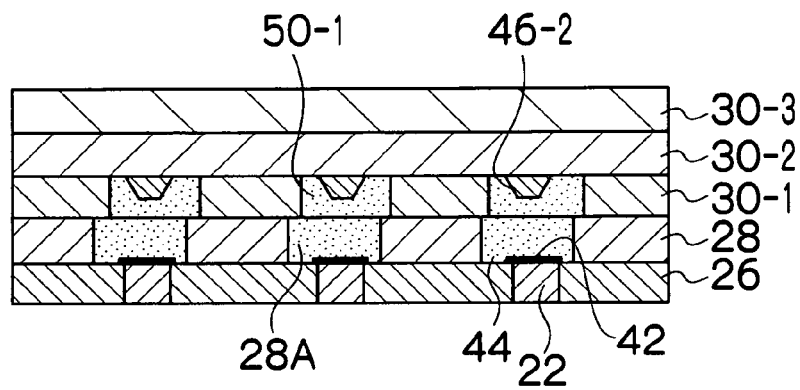
FIG. 7 is a cross-sectional diagram along line 7-7 in FIG. 5.
Figure 8:
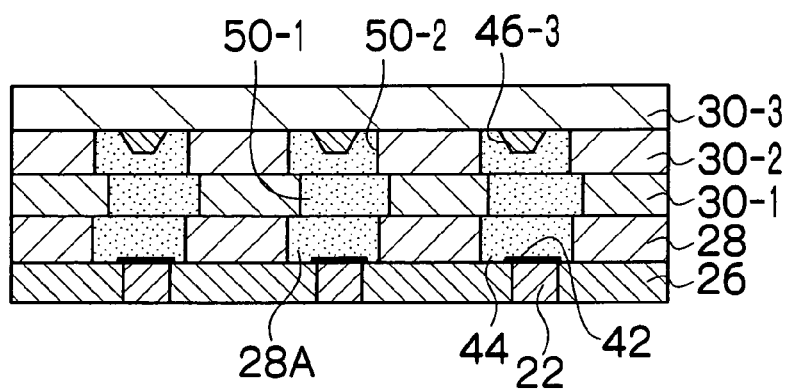
FIG. 8 is a cross-sectional diagram along line 8-8 in FIG. 5.
Figure 9:
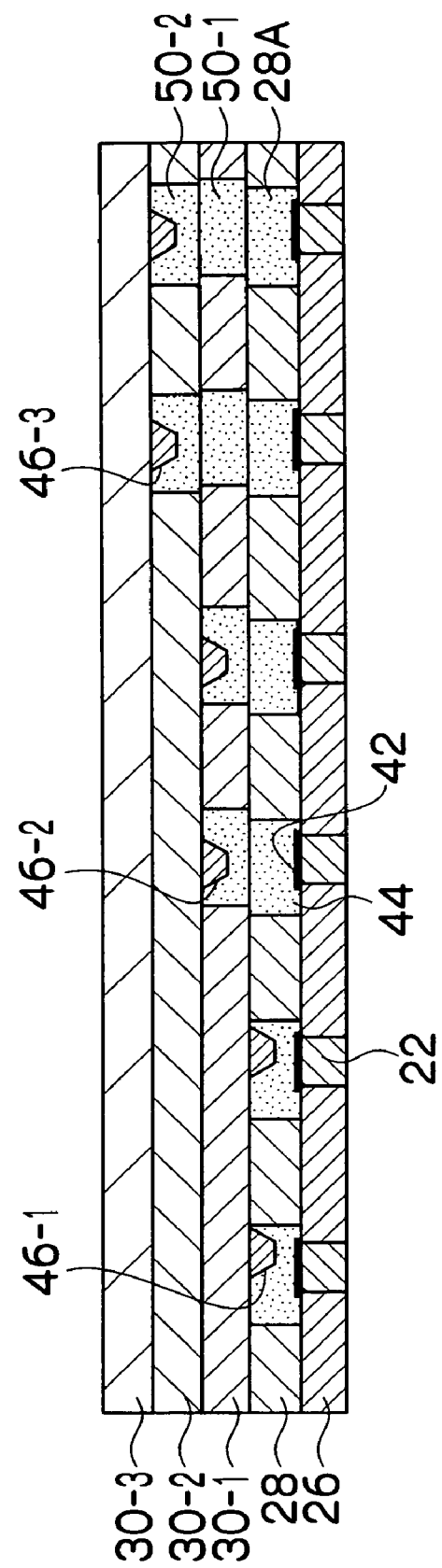
FIG. 9 is a cross-sectional diagram along line 9-9 in FIG. 5.

FIG. 5 is a plan diagram showing a state where the three FPC boards 30-1 to 30-3 have been mutually superimposed, and FIGS. 6 to 9 show cross-sectional diagrams along lines 6-6, 7-7, 8-8 and 9-9, respectively, in FIG. 5.

As shown in FIGS. 5 to 9, since the through holes 28A, 50-1 and 50-2 which are larger than the lands 42 are formed, and the connections between the FPC boards 30-1 to 30-3 are ensured by filling the conductive material 44 into these through holes 28A, 50-1 and 50-2, then it is possible to absorb positional variations when assembling the FPC boards 30-1 to 30-3.

Figure 10:
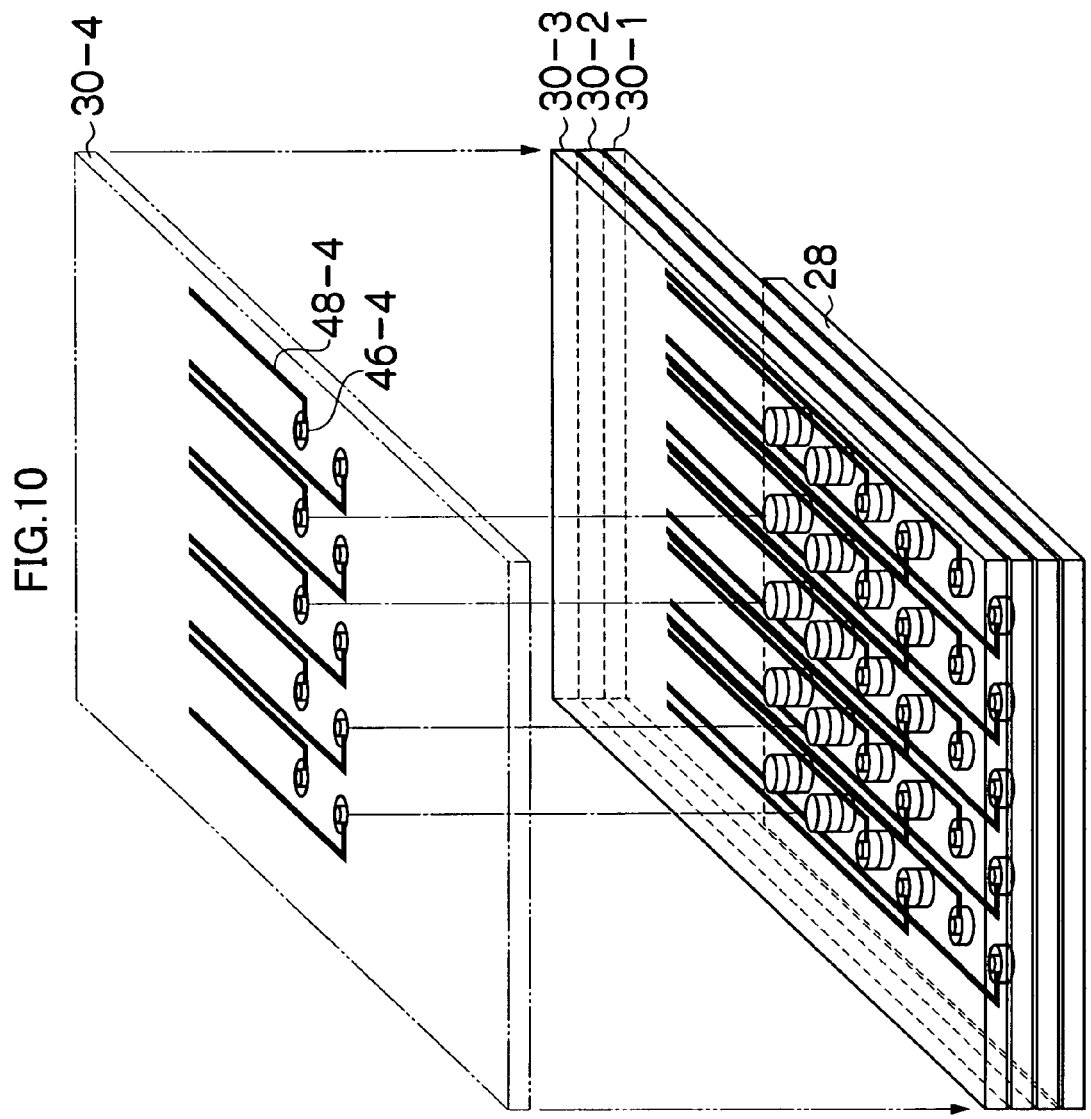
FIG. 10 is an oblique diagram showing a state where a plurality of FPC boards are mutually superimposed.

(Step 5) After successively superimposing and bonding together the three FPC boards 30-1 to 30-3 as described above, the conductive material 44 is filled into the through holes 50-3 of the third FPC board 30-3, similarly to the first and second FPC boards 30-1 and 30-2, and the fourth FPC board 30-4 is arranged thereon and bonded with adhesive (see FIG. 10).

The fourth FPC board 30-4 has the wiring patterns 48-4 and the bumps 46-4 to be connected to the remaining lands 42 other than the lands 42 connected to the first to third FPC boards 30-1 to 30-3 in the lower layers. Since the fourth FPC board 30-4 is disposed in the uppermost layer and does not require connection to another FPC board on the far side from the cavity substrate 28, then there is no need to have through holes and to fill same with conductive material in order to create electrical connection with other FPC boards.

The present embodiment describes a case where the four FPC boards 30-1 to 30-4 are superimposed and bonded, but if superimposing a greater number of FPC boards, then steps similar to the above-described Steps 3 and 4 are repeated.

Figure 11A:
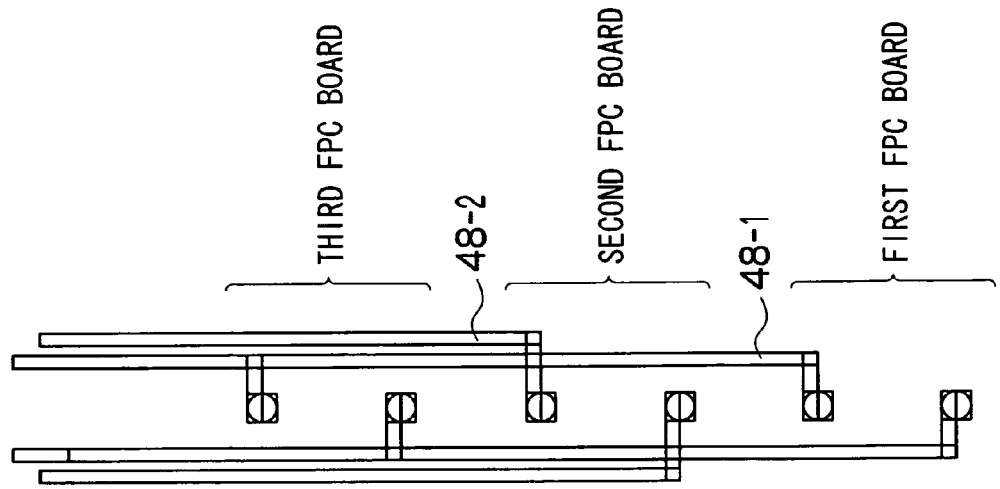
FIGS. 11A and 11B are principal plan diagrams for explaining a compositional embodiment where the positions of the wiring patterns are staggered between adjacent FPC boards.
Figure 11B:
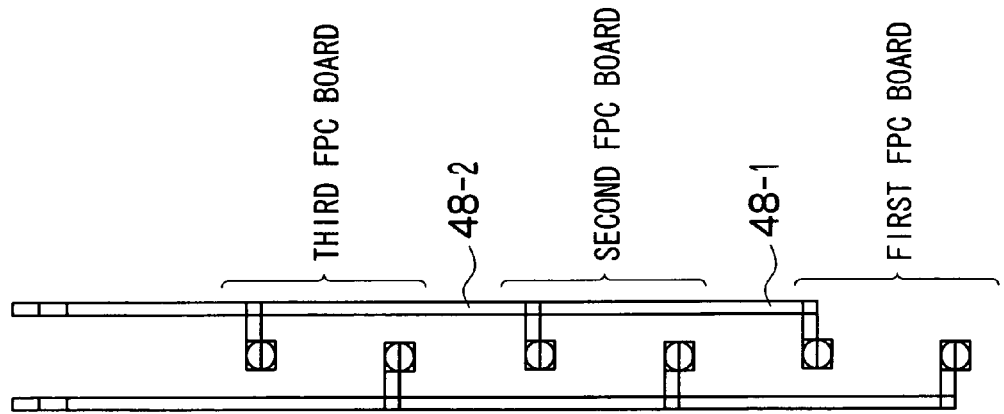

In the embodiment shown in FIGS. 4 to 10, in superimposing together the plurality of FPC boards, the composition is adopted in which the wiring patterns are mutually superimposed between the FPC boards 30-1 to 30-3 as shown in FIG. 11A. Alternatively, as shown in FIG. 11B, it is also possible to adopt a composition in which electromagnetic coupling (cross-talk) is reduced by staggering the superimposition of the wires between the adjacent FPC boards (here, the first and second FPC boards).

Furthermore, in the embodiment shown in FIGS. 4 to 10, the composition is adopted in which the connection of two rows of electrodes in a two-dimensional matrix configuration of electrodes is provided by one FPC board. However, the number of electrodes covered by one FPC board is not limited to two rows as in the present embodiment, and a composition where each FPC board covers a greater number of electrodes is also possible. An appropriate design can be adopted in accordance with factors such as the total number of electrodes, the electrode arrangement configuration, the number of FPC boards used, and the like.

Manufacturing Embodiment 2

A further embodiment of wiring connections is described with reference to FIGS. 12 and 13. In the embodiment shown in FIGS. 12 and 13, wires extend in both directions from the end surfaces of the head in the sub-scanning direction, in respect of the electrodes (lands) 42 having the two-dimensional matrix structure shown in FIG. 2. In this composition, one FPC board provides connections for four rows of electrodes of the electrodes in the two-dimensional matrix arrangement.

Figure 12:
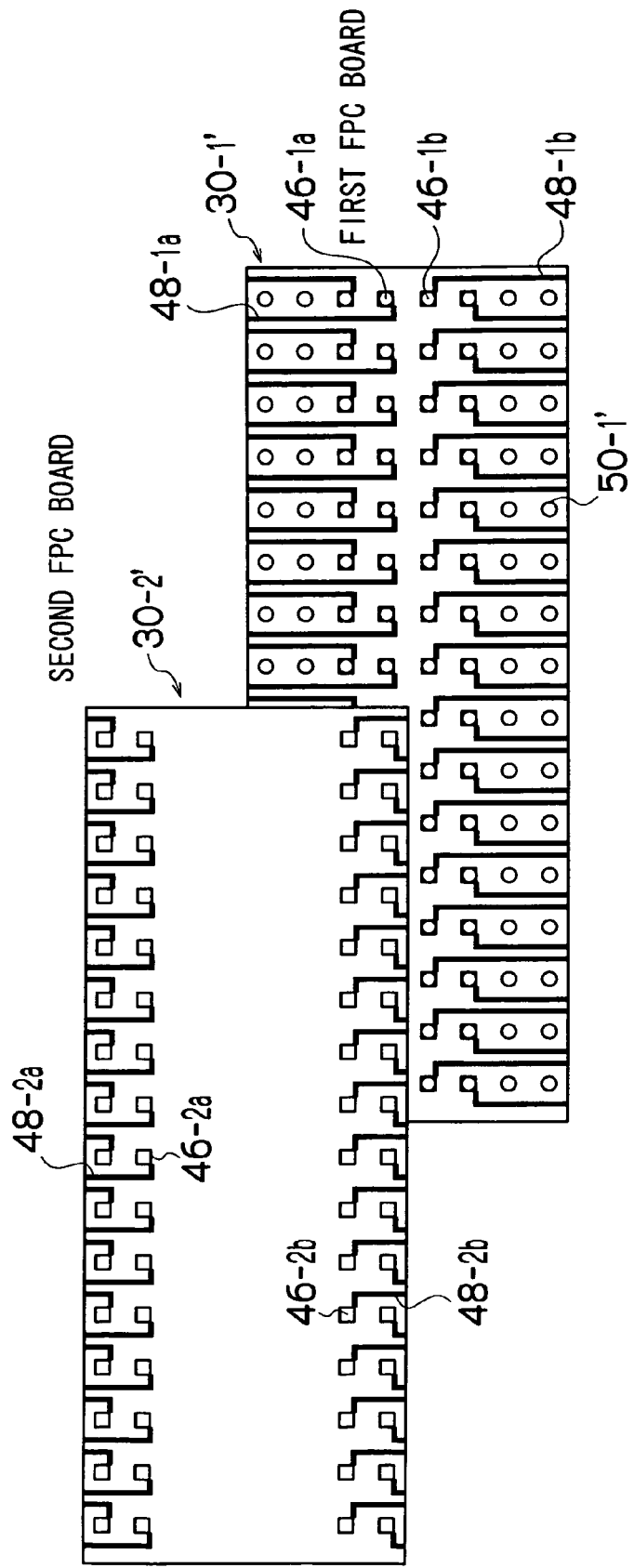
FIG. 12 is a plan diagram showing an embodiment of the composition of two FPC boards which are to be mutually superimposed.

As shown in FIG. 12, the first FPC board 30-1' has wiring patterns 48-1a and 48-1b and bumps 46-1a and 46-1b to be connected to the lands 42 in four rows in the central section of the electrodes (lands) 42 in the two-dimensional matrix structure. When the two-dimensional matrix structure is divided into two in the vertical direction, the wires of the bumps 46-1a (in two rows) positioned in the region on the upper side of the division extend through the wiring pattern 48-1a to the upper end face in FIG. 12. On the other hand, the wires of the bumps 46-1b (in two rows) positioned in the region on the lower side of the division extend through the wiring patterns 48-1b to the lower end face in FIG. 12.

Similarly to the embodiment shown in FIG. 1, the wiring patterns 48-1a and 48-1b and the bumps 46-1a and 46-1b are formed on the lower surface of the FPC board 30-1' (the surface adjacent to the cavity substrate 28 shown in FIG. 1).

The first FPC board 30-1' has through holes 50-1' for creating the electrical connections with the second FPC board 30-2'.

After filling the conductive material 44 into the through holes 28A in the cavity substrate 28 as described with reference to FIG. 1, the first FPC board 30-1' shown in FIG. 12 is arranged onto the cavity substrate 28, and the cavity substrate 28 and the FPC board 30-1' are bonded together with an adhesive (for example, a polyimide adhesive).

Thereupon, the conductive material 44 is filled into the through holes 50-1' of the first FPC board 30-1', and the second FPC board 30-2' is then arranged thereon and bonded with adhesive.

As shown in FIG. 12, the second FPC board 30-2' has wiring patterns 48-2a and 48-2b and bumps 46-2a and 46-2b to be connected to further lands 42 (in four rows) other than the lands 42 connected to the first FPC board 30-1'.

Similarly to the first FPC board 30-1', the wiring patterns 48-2a connecting to the bumps 46-2a (in two rows) positioned in the region on the upper side of the division extend to the upper end face in FIG. 12. On the other hand, the wiring patterns 48-2b connecting to the bumps 46-2b (in two rows) positioned in the region on the lower side of the division extend to the lower end face in FIG. 12.

The bumps 46-2a and 46-2b of the second FPC board 30-2' are registered on the through holes 50-1' of the first FPC board 30-1', and are connected electrically to the lands 42 on the common liquid chamber forming substrate 26 shown in FIG. 3, by means of the conductive material 44 filled into the through holes 50-1'.

Figure 13:
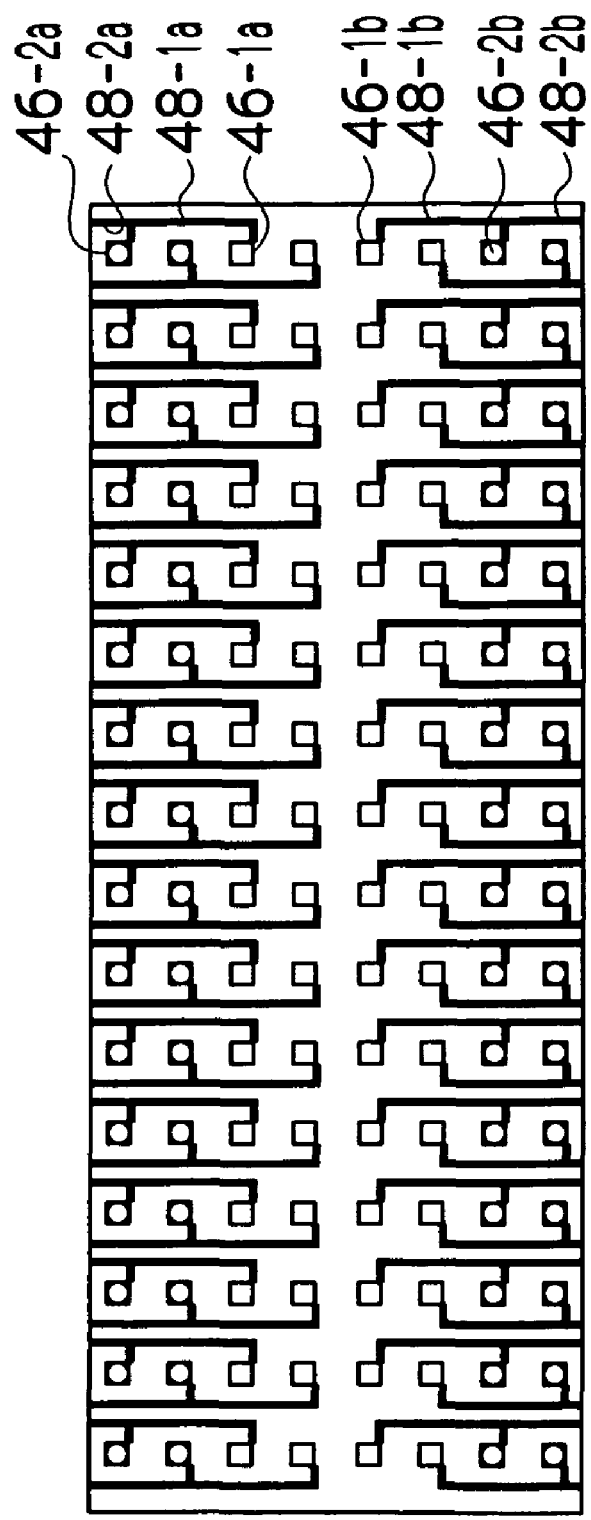
FIG. 13 is a plan diagram showing a state where the two FPC boards in FIG. 12 have been superimposed.

FIG. 13 is a plan diagram showing a state where the two FPC boards 30-1' and 30-2' have been mutually superimposed. Here, the embodiment is described in which the two FPC boards 30-1' and 30-2' are mutually superimposed and bonded, and a mode is also possible in which a larger number of FPC boards are mutually superimposed and bonded.

Furthermore, as described with reference to FIG. 11B, it is also possible to adopt the composition to reduce electromagnetic coupling (cross-talk) by staggering the superimposition of the wires between adjacent FPC boards (here, the first and second FPC boards 30-1' and 30-2').

COMPARATIVE EXAMPLES

Figure 14:
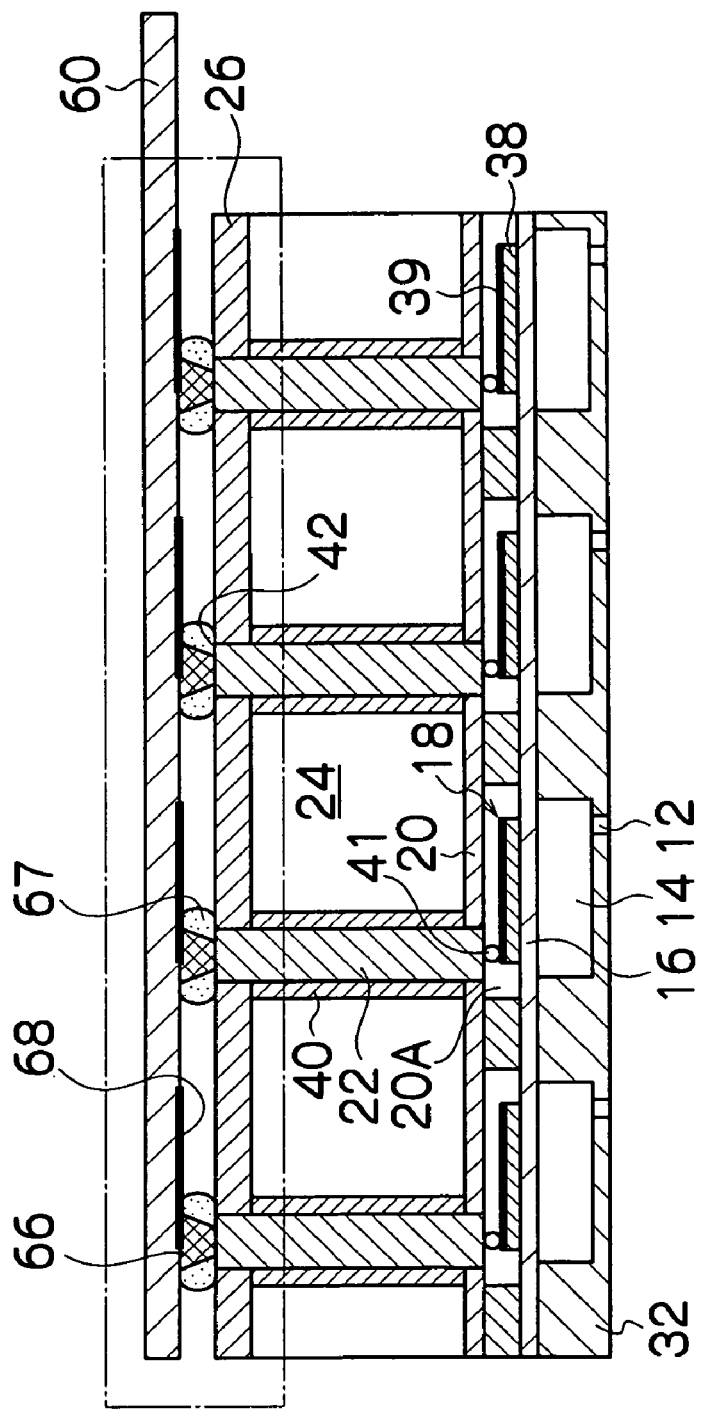
FIG. 14 is a cross-sectional diagram showing the composition of a liquid ejection head including an electrical connection structure relating to a comparative example.

When it is sought to connect wires to a plurality of electrodes (lands 42) arranged in the two-dimensional matrix configuration shown in FIG. 2 by a method other than the methods according to the present invention, then a composition using an FPC board 60 capable of fine wiring (for example, fine wiring having a 1:1 line and space ratio with a line width of 7 μm and a space width of 7 μm), as shown in FIG. 14, can be envisaged. In FIG. 14, elements which are the same as or similar to those in FIG. 1 are denoted with the same reference numerals and description thereof is omitted here.

Looking in particular at the composition of the electrical connection part surrounded by the single-dotted line in FIG. 14, bumps 66 of the fine-patterned FPC board 60 are electrically connected directly to the lands 42 in the two-dimensional matrix arrangement exposed on the upper part of the flow channel structure (the upper surface of the common liquid chamber forming substrate 26), by means of conducting members 67, such as solder, conductive adhesive, or the like. Reference numeral 68 denotes a portion of wiring patterns formed on the FPC board 60.

However, in the case of the composition in which the connections are made by using a fine-patterned FPC board 60 as shown in FIG. 14, it is difficult to suppress undulation (waving) of the FPC board 60 in the connected state. As described in the section on the "Description of the Related Art", in the connections using the bumps 66, since the tips of the bumps 66 generally have a conical shape or a hemispherical shape, and the FPC board 60 is liable to deform, then as the size of the substrate (FPC board) becomes larger, it becomes extremely difficult to achieve positional registration, which leads to difficulty of ensuring both good production yield and connection reliability.

Furthermore, the number of electrodes that can be covered by one FPC board 60 is limited to approximately several tens, and it is impossible to connect all of the electrodes to one FPC board 60 in respect of several tens of thousands of electrodes, as in the case of a high-density inkjet head.

Figure 15:
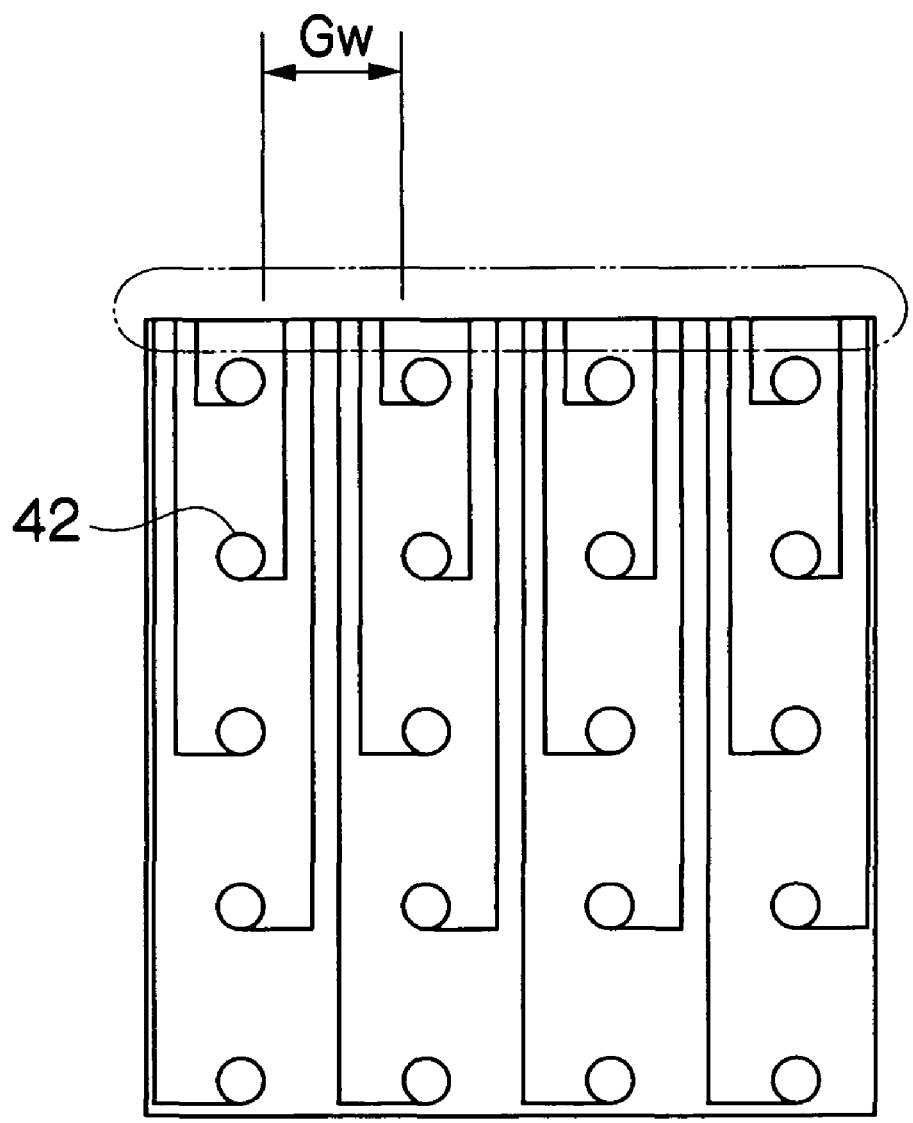
FIG. 15 is a plan diagram showing a schematic view of the principal part of an electrical connection structure relating to the comparative example.

As shown in FIG. 15, a plurality of wires are collected into the gaps (intervals) Gw between the lands 42 in the two-dimensional matrix arrangement, and overall, a large number of wires must be formed, as in the area surrounded by the single-dotted line in FIG. 15. However, due to restrictions on the number of electrodes which can be covered by one fine-patterned FPC board described above, in order to connect all of the lands, it is essential to arrange a large number of FPC strips. However, since insulating material of a prescribed area is required in the end part of each of the FPC strips, then a spare margin of space must be allowed when assembling the FPC strips, and this is a major impediment to achieving high-density wiring.

Moreover, there is also a problem with the fine-patterned FPC boards in that since they have wiring patterns of extremely narrow width, then the wiring resistance is high.

From the cost viewpoint as well, the fine-patterned FPC board 60 is formed by using a semi-additive technique, for example, and as an approximate estimate, the cost per board is approximately ten times higher than an FPC board of a class of "line and space=50 µm" (line width (L): 50 µm, and space width (S): 50 µm) formed by using a subtractive method.

In contrast to this, according to the embodiments of the present invention described with reference to FIGS. 1 to 13, the pair of the land 42 and one of the bumps 46-1 to 46-4 that are to be connected together are separated from adjacent electrodes by means of the cavity substrate 28, and the land and the bump are connected reliably through the conductive material 44 filled in the through hole 28A in the cavity substrate 28. Thereby, connection reliability is improved and incorrect connections with adjacent electrodes are prevented.

Furthermore, by means of the electrical connection structure according to the embodiments of the present invention, it is possible to achieve connections while ensuring the flatness of the FPC board. Moreover, according to the embodiments of the present invention, vias are formed through two or three layers by filling the conductive material 44 into the through holes 50-1 to 50-3 in the FPC boards 30-1 to 30-3, and it is thereby possible to make the connection to all of the electrodes in the two-dimensional matrix electrodes of narrow pitch, by superimposing the inexpensive single-side FPC boards 30-1 to 30-3 (e.g., in a class of "line and space=50 µm"), which are not fine-patterned FPC boards. In this, by forming the through holes 28A in the cavity substrate 28 and the through holes 50-1 to 50-3 in the FPC boards 30-1 to 30-3 to a size which prevents contact of adjacent electrodes, a merit is obtained in that the spare margin in the size of the through holes absorbs positional variations in the assembly.

Moreover, according to the embodiments of the present invention, there is no need to arrange a large number of FPC strips in respect of a two-dimensional matrix structure, and hence wiring loss due to the margins between the FPC strips does not occur. In the connection method shown in FIG. 14, it is necessary to apply pressure from the upper side during the assembly, and this applied pressure is concentrated in the region of the bumps 66, and hence it is difficult to achieve uniform application of the pressure over a large surface area. On the other hand, according to the embodiments of the present invention, it is possible to apply pressure uniformly over the whole area of the electrodes during the assembly.

Embodiment of Application to Inkjet Recording Apparatus

Next, an embodiment of an image forming apparatus using the liquid ejection head 10 having the structure shown in FIGS. 1 to 13 is described.

Figure 16:
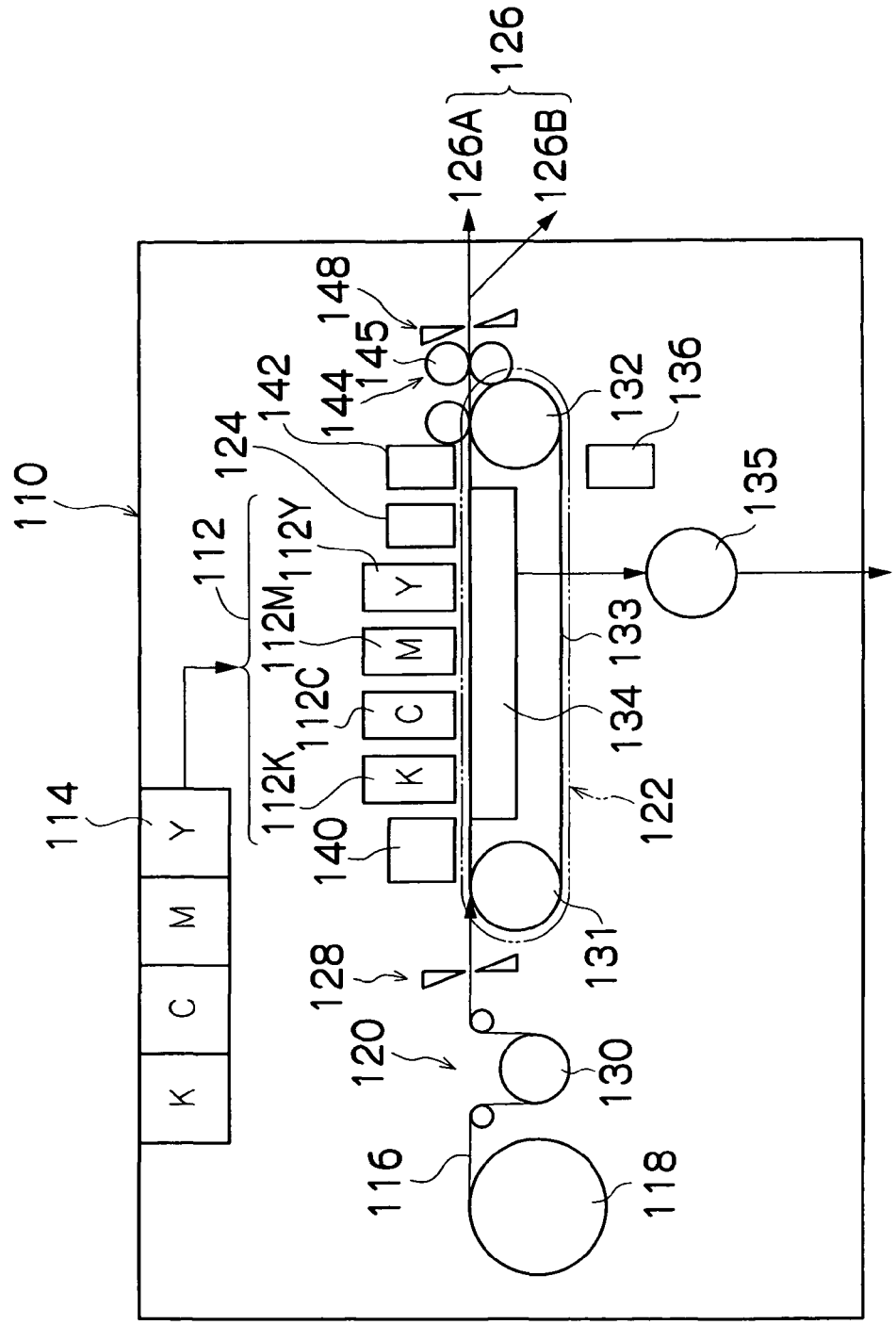
FIG. 16 is a general schematic drawing of an inkjet recording apparatus according to an embodiment of the present invention.

FIG. 16 is a general schematic drawing of an inkjet recording apparatus which forms one embodiment of an image forming apparatus according to the present invention. As shown in FIG. 16, the inkjet recording apparatus 110 comprises: a print unit 112 having a plurality of inkjet heads (hereinafter, called "heads") 112K, 112C, 112M and 112Y provided for ink colors of black (K), cyan (C), magenta (M), and yellow (Y), respectively; an ink storing and loading unit 114 for storing inks to be supplied to the heads 112K, 112C, 112M and 112Y; a paper supply unit 118 for supplying recording paper 116 forming a recording medium; a decurling unit 120 for removing curl in the recording paper 116; a belt conveyance unit 122, disposed facing the nozzle face (ink ejection face) of the print unit 112, for conveying the recording paper 116 while keeping the recording paper 116 flat; a print determination unit 124 for reading the printed result produced by the print unit 112; and a paper output unit 126 for outputting recorded recording paper (printed matter) to the exterior.

The liquid ejection head 10 shown in FIGS. 1 to 13 is used for each of the heads 112K, 112C, 112M and 112Y of the print unit 112.

The ink storing and loading unit 114 shown in FIG. 16 has ink tanks for storing the inks of K, C, M and Y to be supplied to the heads 112K, 112C, 112M and 112Y, and the tanks are connected to the heads 112K, 112C, 112M and 112Y by means of prescribed channels. The ink storing and loading unit 114 has a warning device (for example, a display device or an alarm sound generator) for warning when the remaining amount of any ink is low, and has a mechanism for preventing loading errors among the colors.

In FIG. 16, a magazine for rolled paper (continuous paper) is shown as an example of the paper supply unit 118; however, more magazines with paper differences such as paper width and quality may be jointly provided. Moreover, papers may be supplied with cassettes that contain cut papers loaded in layers and that are used jointly or in lieu of the magazine for rolled paper.

In the case of a configuration in which a plurality of types of recording medium (media) can be used, it is preferable that an information recording medium such as a bar code and a wireless tag containing information about the type of media is attached to the magazine, and by reading the information contained in the information recording medium with a predetermined reading device, the type of recording medium to be used (type of media) is automatically determined, and ink-droplet ejection is controlled so that the ink-droplets are ejected in an appropriate manner in accordance with the type of medium.

The recording paper 116 delivered from the paper supply unit 118 retains curl due to having been loaded in the magazine. In order to remove the curl, heat is applied to the recording paper 116 in the decurling unit 120 by a heating drum 130 in the direction opposite from the curl direction in the magazine. The heating temperature at this time is preferably controlled so that the recording paper 116 has a curl in which the surface on which the print is to be made is slightly round outward.

In the case of the configuration in which roll paper is used, a cutter (first cutter) 128 is provided as shown in FIG. 16, and the continuous paper is cut into a desired size by the cutter 128. When cut papers are used, the cutter 128 is not required.

The decurled and cut recording paper 116 is delivered to the suction belt conveyance unit 122. The suction belt conveyance unit 122 has a configuration in which an endless belt 133 is set around rollers 131 and 132 so that the portion of the endless belt 133 facing at least the nozzle face of the printing unit 112 and the sensor face of the print determination unit 124 forms a horizontal plane (flat plane).

The belt 133 has a width that is greater than the width of the recording paper 116, and a plurality of suction apertures (not shown) are formed on the belt surface. A suction chamber 134 is disposed in a position facing the sensor surface of the print determination unit 124 and the nozzle surface of the printing unit 112 on the interior side of the belt 133, which is set around the rollers 131 and 132, as shown in FIG. 16. The suction chamber 134 provides suction with a fan 135 to generate a negative pressure, and the recording paper 116 is held on the belt 133 by suction. It is also possible to use an electrostatic attraction method, instead of a suction-based attraction method.

The belt 133 is driven in the clockwise direction in FIG. 16 by the motive force of a motor (not shown) being transmitted to at least one of the rollers 131 and 132, which the belt 133 is set around, and the recording paper 116 held on the belt 133 is conveyed from left to right in FIG. 16.

Since ink adheres to the belt 133 when a marginless print job or the like is performed, a belt-cleaning unit 136 is disposed in a predetermined position (a suitable position outside the printing area) on the exterior side of the belt 133. Although the details of the configuration of the belt-cleaning unit 136 are not shown, examples thereof include a configuration of nipping cleaning rollers such as a brush roller and a water absorbent roller, an air blow configuration in which clean air is blown onto the belt 133, or a combination of these. In the case of the configuration of nipping the cleaning rollers, it is preferable to make the line velocity of the cleaning rollers different than that of the belt 133 to improve the cleaning effect.

The inkjet recording apparatus 110 can comprise a roller nip conveyance mechanism, instead of the suction belt conveyance unit 122. However, there is a drawback in the roller nip conveyance mechanism that the print tends to be smeared when the printing area is conveyed by the roller nip action because the nip roller makes contact with the printed surface of the paper immediately after printing. Therefore, the suction belt conveyance in which nothing comes into contact with the image surface in the printing area is preferable.

A heating fan 140 is disposed on the upstream side of the printing unit 112 in the conveyance pathway formed by the suction belt conveyance unit 122. The heating fan 140 blows heated air onto the recording paper 116 to heat the recording paper 116 immediately before printing so that the ink deposited on the recording paper 116 dries more easily.

The heads 112K, 112C, 112M and 112Y of the printing unit 112 are full line heads having a length corresponding to the maximum width of the recording paper 116 used with the inkjet recording apparatus 110, and comprising a plurality of nozzles for ejecting ink arranged on a nozzle face through a length exceeding at least one edge of the maximum-size recording medium (namely, the full width of the printable range).

The print heads 112K, 112C, 112M and 112Y are arranged in color order (black (K), cyan (C), magenta (M) and yellow (Y)) from the upstream side in the feed direction of the recording paper 116, and these respective heads 112K, 112C, 112M and 112Y are fixed extending in a direction substantially perpendicular to the conveyance direction of the recording paper 116.

A color image can be formed on the recording paper 116 by ejecting inks of different colors from the heads 112K, 112C, 112M and 112Y, respectively, onto the recording paper 116 while the recording paper 116 is conveyed by the suction belt conveyance unit 122.

By adopting a configuration in which the full line heads 112K, 112C, 112M and 112Y having nozzle rows covering the full paper width are provided for the respective colors in this way, it is possible to record an image on the full surface of the recording paper 116 by performing just one operation (one sub-scanning operation) of relatively moving the recording paper 116 and the printing unit 112 in the paper conveyance direction (the sub-scanning direction), in other words, by means of a single sub-scanning action. Higher-speed printing is thereby made possible and productivity can be improved in comparison with a shuttle type head configuration in which a recording head reciprocates in the main scanning direction.

Although the configuration with the KCMY standard colors (four colors) is described in the present embodiment, combinations of the ink colors and the number of colors are not limited to those. Light inks, dark inks or special color inks can be added as required. For example, a configuration is possible in which inkjet heads for ejecting light-colored inks such as light cyan and light magenta are added. Furthermore, there are no particular restrictions of the sequence in which the heads of respective colors are arranged.

The print determination unit 124 illustrated in FIG. 16 has an image sensor (line sensor or area sensor) for capturing an image of the droplet ejection result of the print unit 112, and functions as a device to check for ejection defects such as blockages, landing position displacement, and the like, of the nozzles, on the basis of the image of ejected droplets read in by the image sensor. A test pattern or the target image printed by the print heads 112K, 112C, 112M, and 112Y of the respective colors is read in by the print determination unit 124, and the ejection performed by each head is determined. Ejection determination is made by, for example, finding presence or absence of ejection, measuring dot sizes, and dot landing positions.

A post-drying unit 142 is disposed following the print determination unit 124. The post-drying unit 142 is a device to dry the printed image surface, and includes a heating fan, for example. It is preferable to avoid contact with the printed surface until the printed ink dries, and a device that blows heated air onto the printed surface is preferable.

In cases in which printing is performed with dye-based ink on porous paper, blocking the pores of the paper by the application of pressure prevents the ink from coming contact with ozone and other substance that cause dye molecules to break down, and has the effect of increasing the durability of the print.

A heating/pressurizing unit 144 is disposed following the post-drying unit 142. The heating/pressurizing unit 144 is a device to control the glossiness of the image surface, and the image surface is pressed with a pressure roller 145 having a predetermined uneven surface shape while the image surface is heated, and the uneven shape is transferred to the image surface.

The printed matter generated in this manner is outputted from the paper output unit 126. The target print (i.e., the result of printing the target image) and the test print are preferably outputted separately. In the inkjet recording apparatus 110, a sorting device (not shown) is provided for switching the outputting pathways in order to sort the printed matter with the target print and the printed matter with the test print, and to send them to paper output units 126A and 126B, respectively. When the target print and the test print are simultaneously formed in parallel on the same large sheet of paper, the test print portion is cut and separated by a cutter (second cutter) 148. Although not shown in FIG. 16, the paper output unit 126A for the target prints is provided with a sorter for collecting prints according to print orders.

Structure of Head

Next, the structure of the head is described. The heads 112K, 112C, 112M and 112Y of the respective ink colors have the same structure, and a reference numeral 150 is hereinafter designated to any of the heads.

Figure 17:
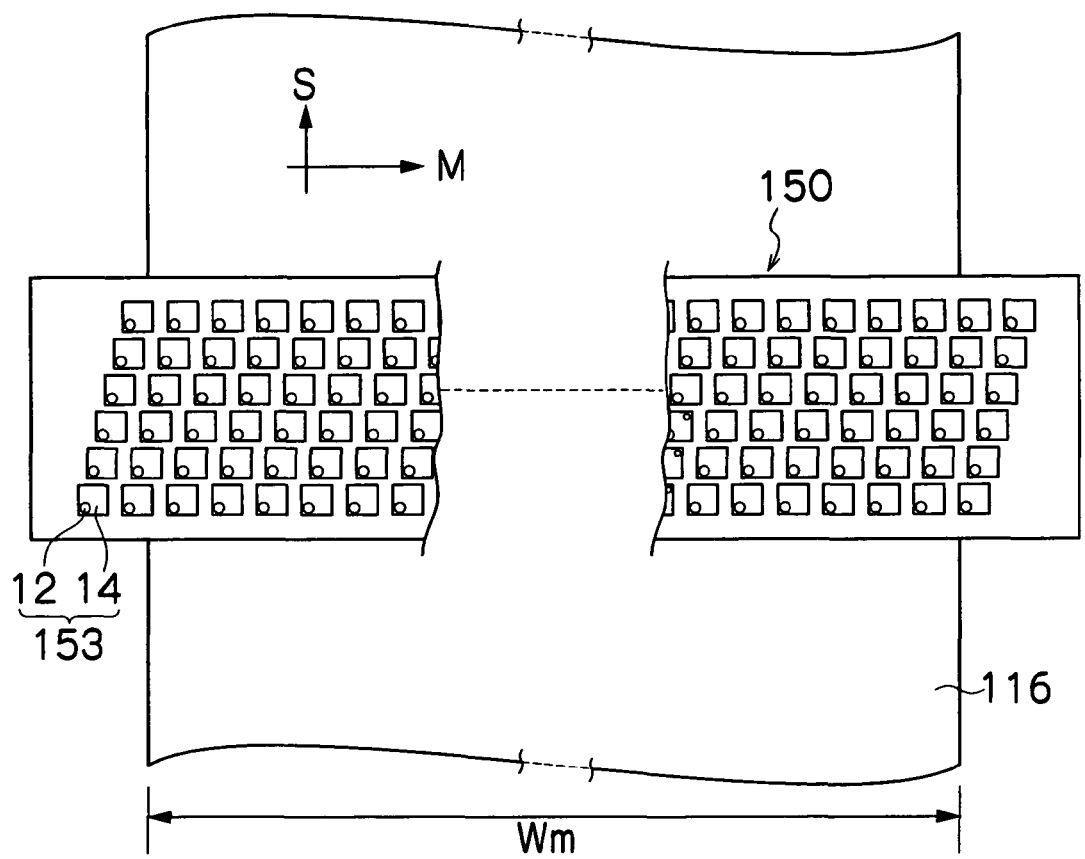
FIG. 17 is a plan view perspective diagram showing an embodiment of the composition of a print head.
Figure 18:
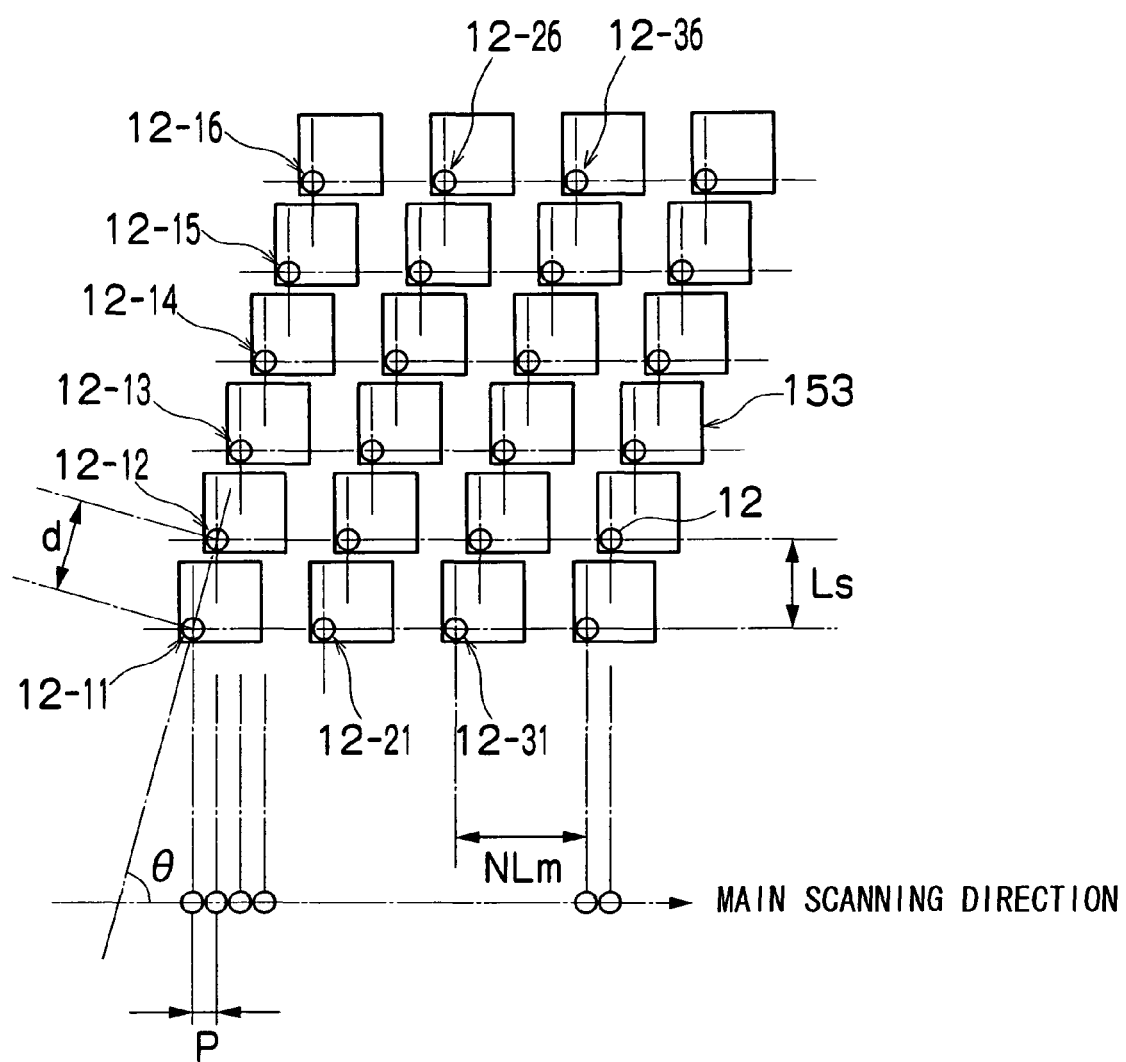
FIG. 18 is an enlarged view showing a nozzle arrangement in the print head illustrated in FIG. 17.

FIG. 17 is a plan view perspective diagram showing an embodiment of the structure of the head 150, and FIG. 18 is a principal expanded view of same. As shown in FIG. 17, this head 150 has a structure in which a plurality of ink chamber units, each comprising a nozzle 12 forming an ink ejection port, a pressure chamber 14 corresponding to the nozzle 12, (namely, liquid droplet ejection elements each forming a unit recording element corresponding to one nozzle) 153 are arranged two-dimensionally in a matrix configuration. Nozzle rows equal to or exceeding a length corresponding to the full width Wm of the recording medium (recording paper 116) are constituted in a direction (indicated by arrow M; main scanning direction) which is substantially perpendicular to the feed direction of the recording medium (recording paper 116) (indicated by arrow S; sub-scanning direction).

The pressure chamber 14 provided corresponding to each of the nozzles 12 is approximately square-shaped in plan view, and the nozzle 12 is provided at a corner section in the vicinity of the apex of the pressure chamber 14. Although not shown in FIG. 18, an inlet port for supplying ink (a connection port to the common liquid chamber 24 shown in FIG. 1) is provided in a corner section in the vicinity of another apex of the pressure chamber 14, and desirably, a corner section on a diagonal with respect to the nozzle 12.

The shape of the pressure chamber 14 is not limited to that of the present embodiment and various modes are possible in which the planar shape is a quadrilateral shape (rhombic shape, rectangular shape, or the like), a pentagonal shape, a hexagonal shape, or other polygonal shape, or a circular shape, elliptical shape, or the like.

The internal structure of the head 150 is shown in FIG. 1, and the plurality of pressure chambers 14 are connected to the common liquid chamber 24 (shown in FIG. 1, and not shown in FIG. 18) via the ink supply ports. The common liquid chamber 24 in the present embodiment is constituted as one large space formed over the whole region in which the pressure chambers 14 are formed, in such a manner that the ink is supplied to all of the pressure chambers 14 in the head 150, but it is not limited to being formed as a single space in this way. The common liquid chamber 24 may also be divided into several regions and formed as a plurality of chambers, and a prescribed flow channel structure capable of restricting the ink flow may be adopted.

As shown in FIG. 18, the head 150 according to the present embodiment has a structure in which the plurality of ink chamber units 153 are arranged in a matrix configuration (an oblique lattice configuration) according to a fixed arrangement pattern following the main scanning direction (row direction) and an oblique column direction which is not perpendicular to the row direction (in FIG. 18, the column direction is a substantially longitudinal direction). By adopting this structure, a head having a nozzle arrangement of high density is achieved.

More specifically, by adopting a structure in which a plurality of ink chamber units 153 are arranged at a uniform pitch d in line with a direction forming an angle of θ with respect to the main scanning direction (row direction), the pitch P of the nozzles projected so as to align in the main scanning direction is d×cos θ, and hence the nozzles 12 can be regarded to be equivalent to those arranged linearly at a fixed pitch P along the main scanning direction. Such configuration results in a nozzle structure in which the nozzle row projected in the main scanning direction has a high nozzle density of up to 2,400 nozzles per inch.

To represent the two-dimensional arrangement in FIG. 18 in a different manner, assuming a uniform value for the nozzle pitch, NLm, in the nozzle row of nozzles 12 aligned in the main scanning direction (row direction) (namely, assuming that the nozzle pitch in the main scanning direction is the same value of NLm in all of the rows), then the nozzles 12-$ij$ of the respective rows are arranged in a staggered configuration by varying the nozzle positions in the main scanning direction, between each of the rows. In other words, taking the number of nozzle rows aligned in the main scanning direction of the two-dimensional nozzle arrangement (in other words, the number of nozzles in the sub-scanning direction) in the nozzle surface (ejection surface), to be n (in FIG. 18, n=6), and taking the effective nozzle pitch in the main scanning direction between nozzles which eject droplets to form dots aligned in the main scanning direction on the recording medium, to be P, then the relationship NLm=n×P is satisfied. Furthermore, the pitch between each row in the sub-scanning direction (the column direction of the nozzle arrangement), Ls, (namely, the pitch between nozzles in the sub-scanning direction) is uniform.

In a full-line head comprising rows of nozzles that have a length corresponding to the entire width of the image recordable width, the "main scanning" is defined as printing one line (a line formed of a row of dots, or a line formed of a plurality of rows of dots) in the width direction of the recording paper (the direction perpendicular to the conveyance direction of the recording paper) by driving the nozzles in one of the following ways: (1) simultaneously driving all the nozzles; (2) sequentially driving the nozzles from one side toward the other; and (3) dividing the nozzles into blocks and sequentially driving the nozzles from one side toward the other in each of the blocks.

In particular, when the nozzles 12 arranged in a matrix such as that shown in FIG. 18 are driven, the main scanning according to the above-described (3) is preferred. More specifically, the nozzles 12-11, 12-12, 12-13, 12-14, 12-15 and 12-16 are treated as a block (additionally; the nozzles 12-21, . . . , 12-26 are treated as another block; the nozzles 12-31, . . . 12-36 are treated as another block; . . . ); and one line is printed in the width direction of the recording medium by sequentially driving the nozzles 12-11, 12-12, . . . , 12-16 in accordance with the conveyance velocity of the recording medium.

On the other hand, "sub-scanning" is defined as to repeatedly perform printing of one line (a line formed of a row of dots, or a line formed of a plurality of rows of dots) formed by the main scanning, while moving the full-line head and the recording medium relatively to each other.

The direction indicated by one line (or the lengthwise direction of a band-shaped region) recorded by main scanning as described above is called the "main scanning direction", and the direction in which sub-scanning is performed, is called the "sub-scanning direction". In other words, in the present embodiment, the conveyance direction of the recording medium is called the sub-scanning direction and the direction perpendicular to same is called the main scanning direction.

According to the head 150 of the present embodiment, it is possible to achieve a high-density nozzle arrangement, as well as being able to achieve improvement in refilling characteristics, and ensuring that there is a sufficient ink supply volume even in the case of ink of relatively high viscosity (for example, approximately 20 cP to 50 cP).

In implementing the present invention, the arrangement of the nozzles is not limited to that of the embodiments illustrated. Furthermore, in the present embodiment, a composition is described in which six nozzle rows of nozzles 12 aligned in the row direction are arranged in the column direction, but in implementing the present invention, the number of nozzle rows n is not limited to this.

The mode of composing a full line head is not limited to the mode shown in FIG. 17 in which nozzle rows are formed through a length corresponding to the full width Wm of the recording medium in the direction substantially perpendicular to the conveyance direction of the recording medium, by means of one head. For example, instead of the composition in FIG. 17, as shown in FIG. 19, a line head having nozzle rows of a length corresponding to the entire width of the recording medium can be formed by arranging and combining, in a staggered matrix, short head modules 150' each having a plurality of nozzles 12 arrayed in a two-dimensional fashion.

Modification

In the present embodiment, an inkjet recording apparatus having a full line type head is described, but the scope of application of the present invention is not limited to this. For example, the present invention may also be applied to a case where images are formed by using a head of a length which is shorter than the width dimension of the recording medium (the recording paper 116 or other print media), and scanning the head a plurality of times, as in a shuttle scanning method.

Moreover, in the foregoing explanation, an inkjet recording apparatus is described, but the scope of application of the present invention is not limited to this. For example, the liquid ejection apparatus according to the present invention may also be applied to a photographic image forming apparatus having a liquid ejection head which applies developing solution, or the like, onto a printing paper by means of a non-contact method. Furthermore, the scope of application of the present invention is not limited to an image forming apparatus, and the present invention may also be applied to various other types of apparatuses which spray various types of liquids, toward an ejection receiving medium, by means of a liquid ejection head (such as an application device, wiring pattern printing device, or the like).

It should be understood, however, that there is no intention to limit the invention to the specific forms disclosed, but on the contrary, the invention is to cover all modifications, alternate constructions and equivalents falling within the spirit and scope of the invention as expressed in the appended claims.

What is claimed is:

1. An electrical connection structure, comprising:
   a first substrate which has a first electrode part;
   a second substrate which has a second electrode part opposing the first electrode part, and a wiring pattern connected to the second electrode part;
   an insulating cavity substrate which is disposed between the first substrate and the second substrate and has a through hole in a position corresponding to the first electrode part, the through hole being deeper than a sum of a height of the first electrode part and a height of the second electrode part and having an opening surface area not smaller than an area of the first electrode part; and
   conductive material which is filled in the through hole, wherein:
   the first substrate has a plurality of the first electrode parts arranged in a two-dimensional matrix configuration;
   there are a plurality of the second substrates mutually superimposed and bonded;
   each of the second substrates has a plurality of the second electrode parts respectively opposing a portion of the first electrode parts;
   the second electrode parts are arranged in the second substrates with no overlaps to each other between the second substrates;
   through holes of the second substrates are formed in at least one of the second substrates to which a further one of the second substrates is bonded on a far side from the insulating cavity substrate in a state of being mutually superimposed and bonded in positions corresponding to the second electrode parts in the further one of the second substrates; and
   the conductive material is filled in the through holes of the at least one of the second substrates.

2. The electrical connection structure as defined in claim 1, wherein each of the second substrates is formed of a flexible printed circuit board which is single-sided and has the wiring pattern and the second electrode parts on a surface on a near side to the insulating cavity substrate in the state of being mutually superimposed and bonded.

3. The electrical connection structure as defined claim 1, wherein the conductive material filled in the through holes is isotropic.

4. The electrical connection structure as defined claim 1, wherein the insulating cavity substrate has a coefficient of linear thermal expansion that is an intermediate value between a coefficient of linear thermal expansion of the first substrate and a coefficient of linear thermal expansion of the second substrates.

5. The electrical connection structure as defined claim 1, wherein:
   the first electrode parts each include first lands arranged on the first substrate; and
   each of the second electrode parts includes a second land and a bump, the second land being arranged on a corresponding one of the second substrates to face a corresponding one of the first lands, the bump being formed in a projecting shape on the second land.

6. An electrical connection structure, comprising:
   a first substrate which has a first electrode part:
   a second substrate which has a second electrode part opposing the first electrode part, and a wiring pattern connected to the second electrode part:
   an insulating cavity substrate which is disposed between the first substrate and the second substrate and has a through hole in a position corresponding to the first electrode part: and
   conductive material which is filled in the through hole, wherein:
   $h_C > h_1 + h_2$ is satisfied where $h_C$ is a depth of the through hole, $h_1$ is a height of the first electrode part, and $h_2$ is a height of the second electrode part:
   the through hole has an opening surface area which is greater than each of a region of the first electrode part and a region of the second electrode part: and
   the region of the first electrode part and the region of the second electrode part are accommodated in the through hole, wherein:
   the first substrate has a plurality of the first electrode parts arranged in a two-dimensional matrix configuration;
   there are a plurality of the second substrates mutually superimposed and bonded;
   each of the second substrates has a plurality of the second electrode parts respectively opposing a portion of the first electrode parts;
   the second electrode parts are arranged in the second substrates with no overlaps to each other between the second substrates;
   through holes of the second substrates are formed in at least one of the second substrates to which a further one of the second substrates is bonded on a far side from the insulating cavity substrate in a state of being mutually superimposed and bonded, in positions corresponding to the second electrode parts in the further one of the second substrates; and
   the conductive material is filled in the through holes of the at least one of the second substrates.

7. The electrical connection structure as defined claim 6, wherein the conductive material filled in the through hole is isotropic.

8. The electrical connection structure as defined claim 6, wherein the insulating cavity substrate has a coefficient of linear thermal expansion which is an intermediate value between a coefficient of linear thermal expansion of the first substrate and a coefficient of linear thermal expansion of the second substrate.

9. The electrical connection structure as defined claim 6, wherein:
   the first electrode part includes a first land arranged on the first substrate; and
   the second electrode part includes a second land and a bump, the second land being arranged on the second substrate to face the first land, the bump being formed in a projecting shape on the second land.

10. The electrical connection structure as defined in claim 6, wherein each of the second substrates is formed of a flexible printed circuit board which is single-sided and has the wiring pattern and the second electrode parts on a surface on a near side to the insulating cavity substrate in the state of being mutually superimposed and bonded.

* * * * *